(12) United States Patent
Sato et al.

(10) Patent No.: US 8,003,544 B2
(45) Date of Patent: Aug. 23, 2011

(54) METHOD OF MANUFACTURING SEMICONDUCTOR DEVICE

(75) Inventors: Koichi Sato, Oita (JP); Keisuke Kikutani, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/881,283

(22) Filed: Sep. 14, 2010

(65) Prior Publication Data

US 2011/0117745 A1    May 19, 2011

(30) Foreign Application Priority Data

Nov. 17, 2009   (JP) .................. 2009-261795

(51) Int. Cl.
*H01L 21/302* (2006.01)
*H01L 21/461* (2006.01)
*H01L 21/311* (2006.01)
*H01L 21/44* (2006.01)

(52) U.S. Cl. ........ 438/717; 438/689; 438/669; 438/703; 257/E21.02; 257/E21.023

(58) Field of Classification Search .................. 438/689, 438/669, 703, 699; 257/E21.02, E21.023
See application file for complete search history.

(56) References Cited

U.S. PATENT DOCUMENTS

| | | | | |
|---|---|---|---|---|
| 7,495,294 B2 * | 2/2009 | Higashitani | .................. | 257/390 |
| 7,906,435 B2 * | 3/2011 | Nishiyama | .................... | 438/717 |
| 2007/0290232 A1 * | 12/2007 | Nishiyama | .................... | 257/202 |
| 2008/0008969 A1 | 1/2008 | Zhou et al. | | |

* cited by examiner

*Primary Examiner* — Alexander G Ghyka
*Assistant Examiner* — Seahvosh J Nikmanesh
(74) *Attorney, Agent, or Firm* — Finnegan, Henderson, Farabow, Garrett & Dunner, L.L.P.

(57) ABSTRACT

A method of manufacturing a semiconductor device according to an embodiment includes processing a second film 14 formed on a semiconductor substrate to a pattern including a plurality of linear parts and end portions formed in an end of each of the linear parts, having a width wider than the linear parts, forming a first pattern 16 by slimming the pattern, forming a second pattern including a first opening 180 that traverses the end portion 141a of the first pattern 16, etching the second film 14 exposed in the first opening 180, and dividing the end portion 141a into a first end portion 142a close to the linear part 140a and a second end portion 143a apart from the linear part 140a.

20 Claims, 26 Drawing Sheets

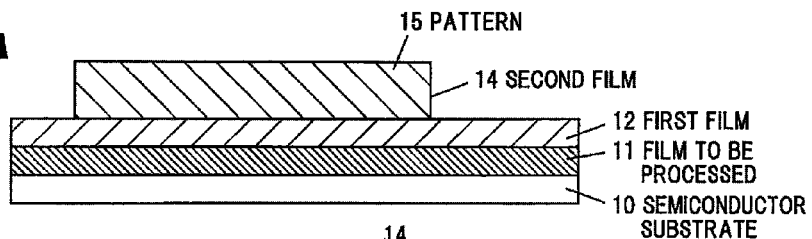
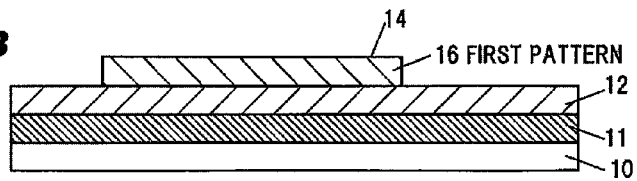
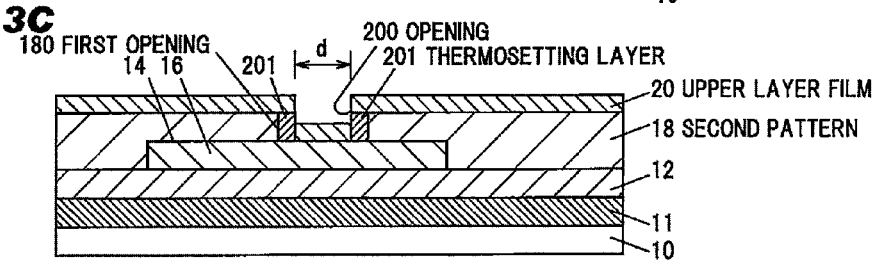
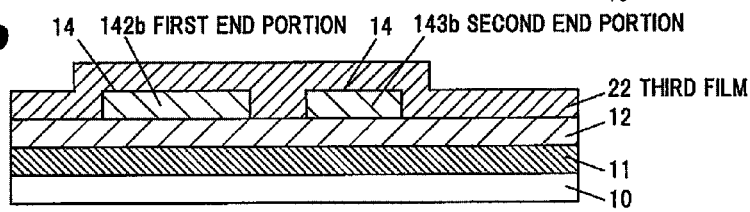
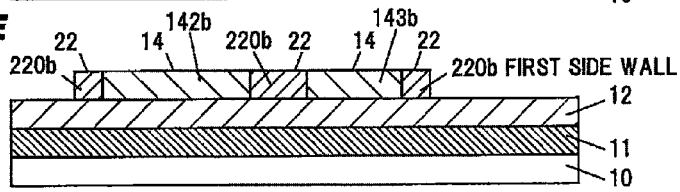
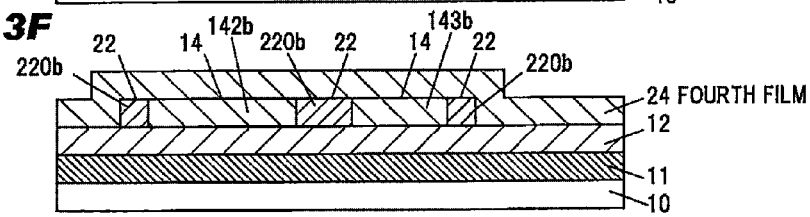

METHOD OF MANUFACTURING SEMICONDUCTOR DEVICE

CROSS-REFERENCE TO RELATED APPLICATIONS

This application is based upon and claims the benefit of priority from prior Japanese Patent Application No. 2009-261795, filed on Nov. 17, 2009, the entire contents of which are incorporated herein by reference.

FIELD

Embodiments described herein relate generally to a method of manufacturing a semiconductor device.

BACKGROUND

As a conventional method of manufacturing a semiconductor device, a method of forming a line and space pattern that has a line width and a space width smaller than an exposure light resolution limit of photolithography method is known. The method is disclosed in, for example, US-2008/0008969 A1.

In accordance with the method of manufacturing a semiconductor device, a line and space pattern of p/6 formed of a first side wall and a third side wall can be obtained on a film to be processed by forming a resist pattern to be the line and space pattern at a pitch (p) of an exposure light resolution limit on the film to be processed, slimming the formed resist pattern so as to have a width of 5 p/6, forming a first side wall so as to have a width equal to an amount of slimming (p/6) on a side surface of the slimmed resist pattern, after removing the resist pattern, forming a second side wall on a side surface of the first side wall so as to have the same width as the first side wall and be formed of a different material from the first side wall in an etching selection ratio, and further forming a third side wall on a side surface of the second side wall so as to have the same width as the first and second side walls and be formed of the same material as the first side wall, and selectively removing the second side wall. The film to be processed is processed by using the first and third side walls as a mask, so that a pattern of 1 p/6 can be formed in the film to be processed.

However, in the conventional method of manufacturing a semiconductor device, since the line width of the film to be processed is smaller than an exposure light resolution limit, it is difficult to form contacts configured to be connected to the pattern of the film to be processed in an upper layer of the pattern of the film to be processed.

BRIEF DESCRIPTION OF THE DRAWING

FIGS. 3A to 3K are cross-sectional views showing one example of a manufacturing process of the semiconductor device according to the first embodiment;

DETAILED DESCRIPTION

Figure 1A:
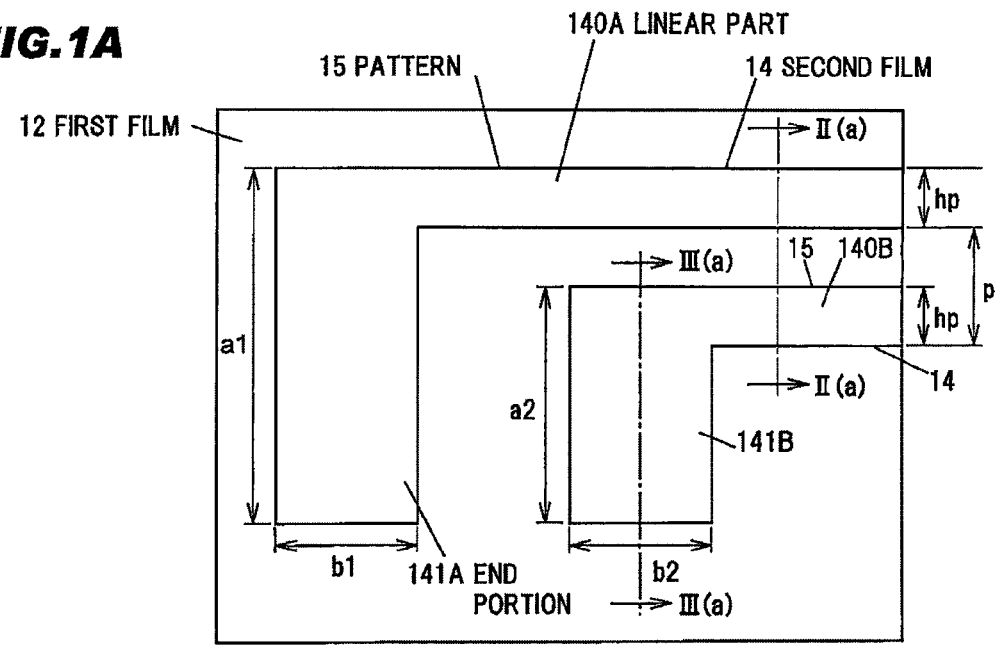
FIGS. 1A to 1K are top views showing one example of a manufacturing process of the semiconductor device according to a first embodiment.

A method of manufacturing a semiconductor device according to an embodiment includes features of (1) to (7) described below.

(1) Forming a first film on a semiconductor substrate and forming a second film on the formed first film
(2) Processing the formed second film to a first pattern including a plurality of linear parts and end portions formed in an end of each of the linear parts, having a width wider than the linear parts
(3) Forming a second pattern on the second film, including a first opening that traverses the end portions of the first pattern
(4) Etching the second film exposed in the first opening of the second pattern, and dividing the end portion into an end portion close to the linear part and an end portion apart from the linear part
(5) After the end portion is divided, forming a third film so as to cover the first and second films, and etching back the third film so as to form a first side wall formed of the third film in a side surface of the second film
(6) Forming a fourth film so as to cover the first to third films, and etching back the fourth film so as to form a second side wall formed of the fourth film on side surfaces of the first film so as to form a closed loop pattern sequentially formed around the divided end portion
(7) Dividing the closed loop pattern or a closed loop pattern formed in the first film by using the second side wall as a mask In accordance with the above-mentioned embodiment, contacts configured to be connected to the pattern of the film to be processed can be easily formed in an upper layer of the pattern of the film to be processed that becomes a line and space pattern smaller than an exposure light resolution limit of photolithography method.

First Embodiment (Manufacturing Method of Semiconductor Device)

Figure 1B:
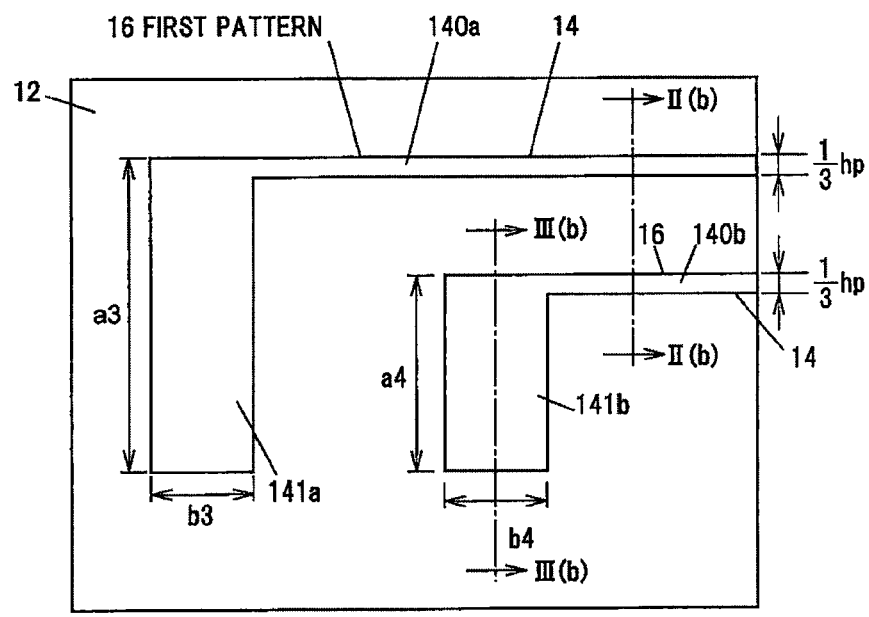
Figure 1C:
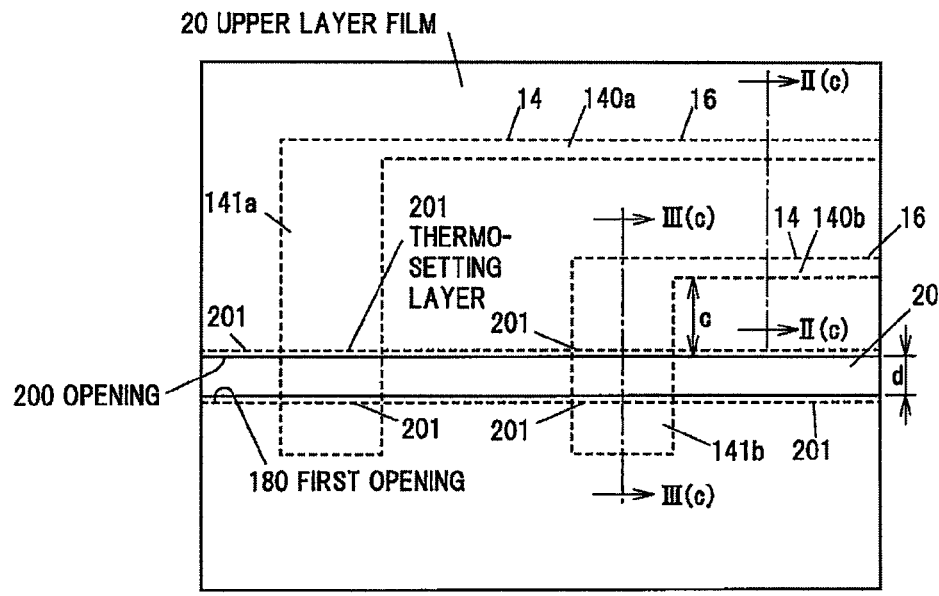
Figure 1D:
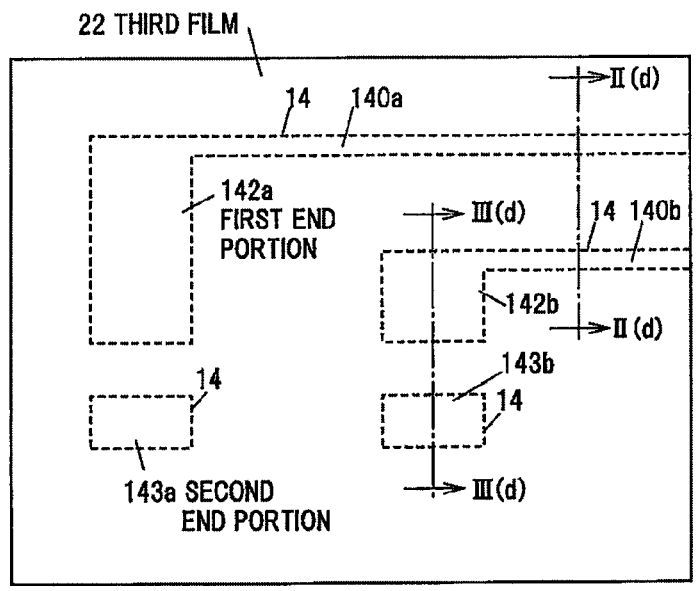
Figure 1E:
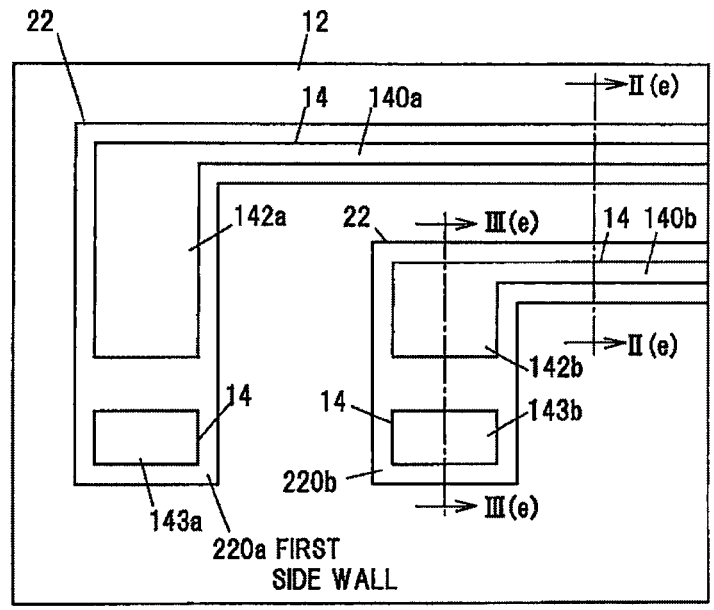
Figure 1F:
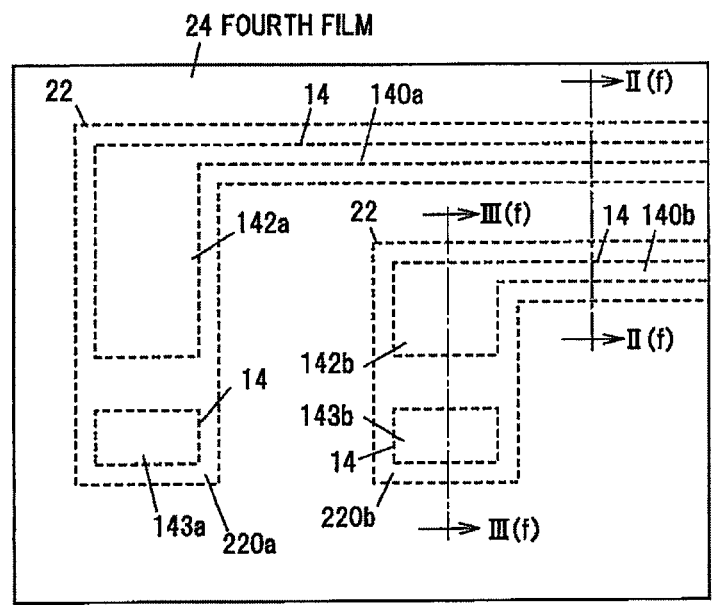
Figure 1G:
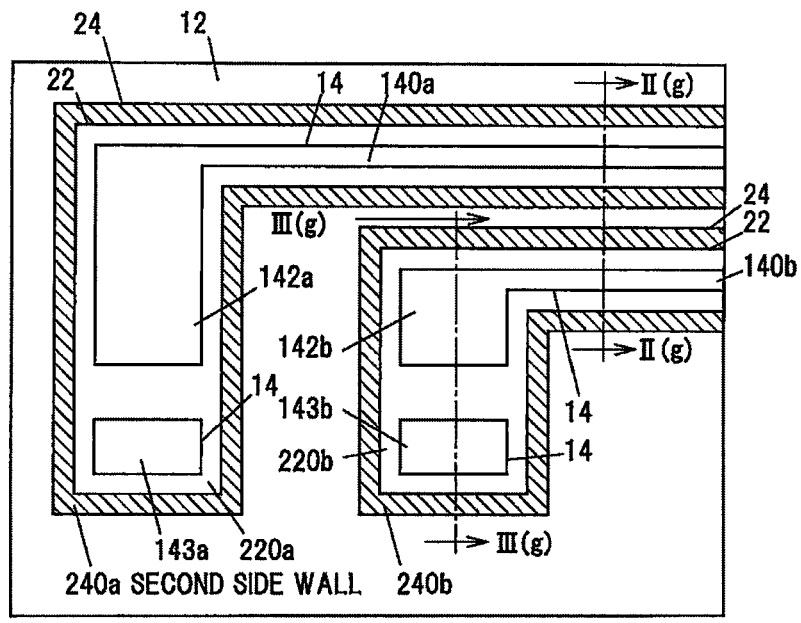
Figure 1H:
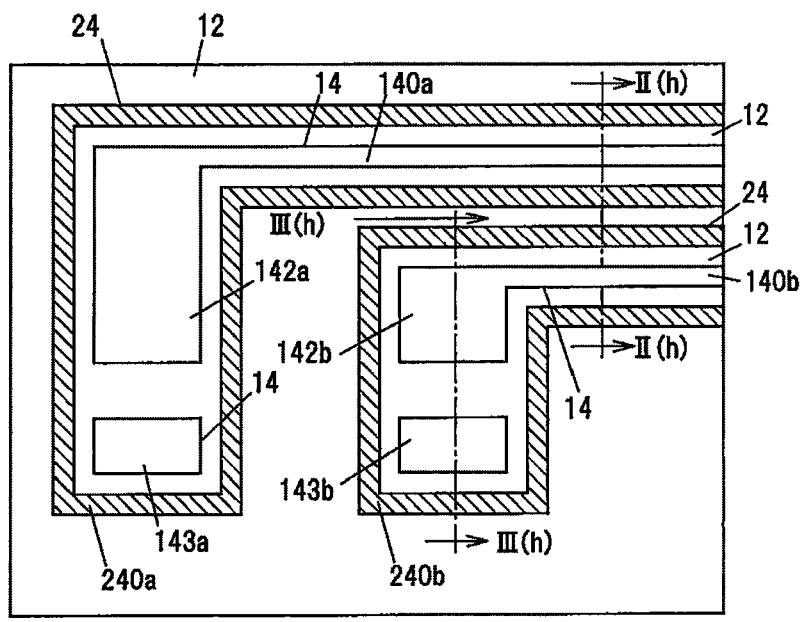
Figure 1I:
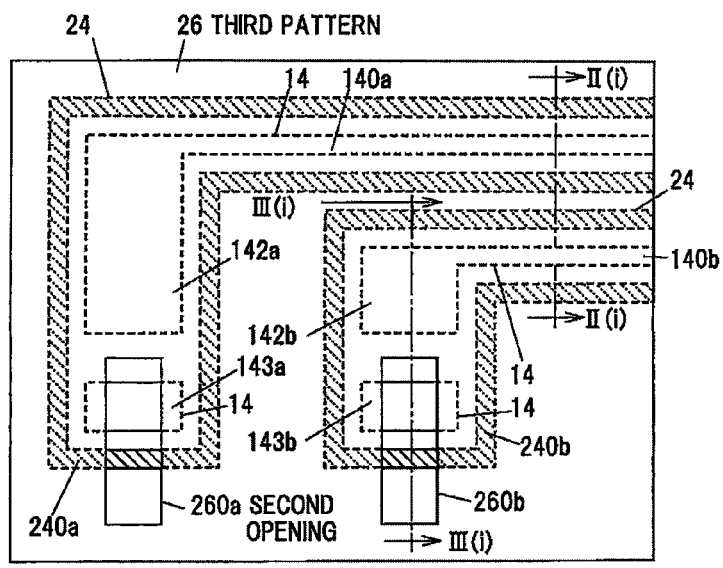
Figure 1J:
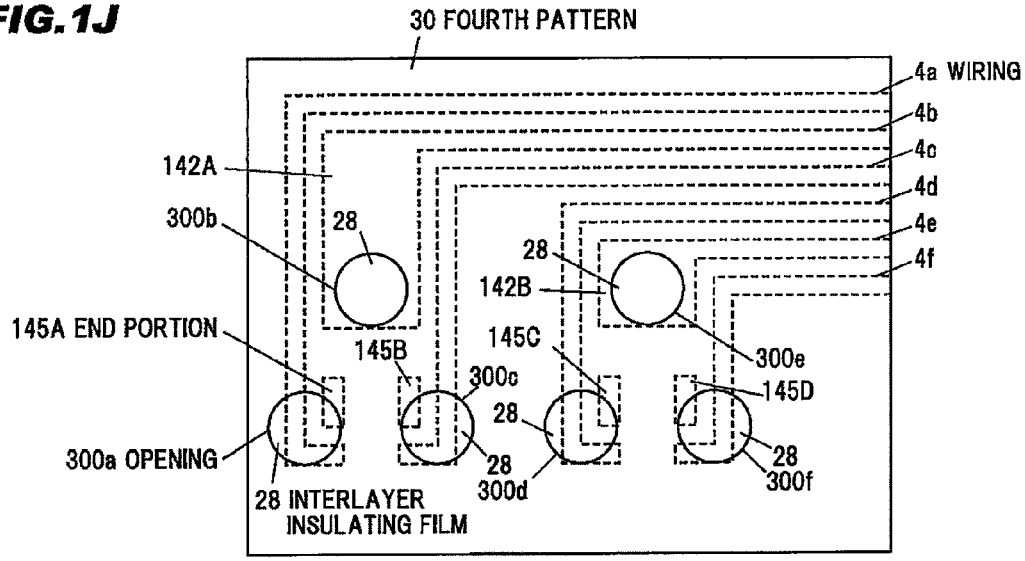
Figure 1K:
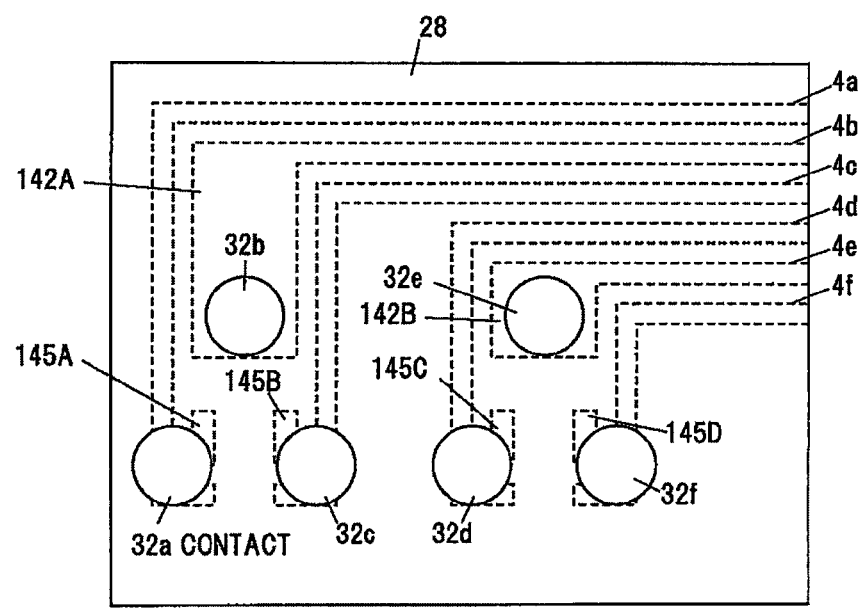
Figure 2A:
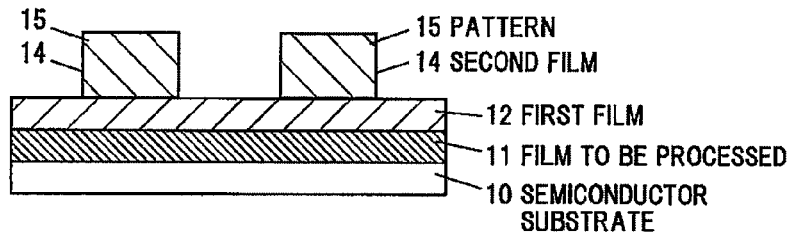
FIGS. 2A to 2K are cross-sectional views showing one example of a manufacturing process of the semiconductor device according to the first embodiment.
Figure 2B:
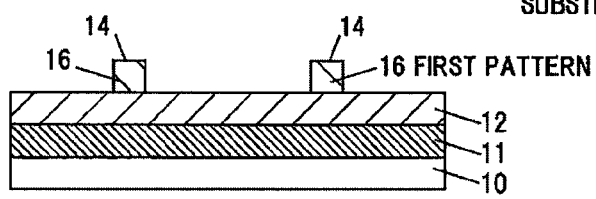
Figure 2C:
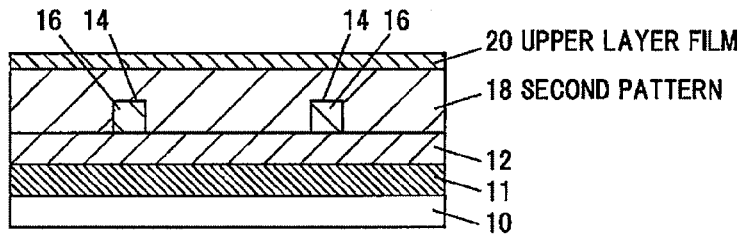
Figure 2D:
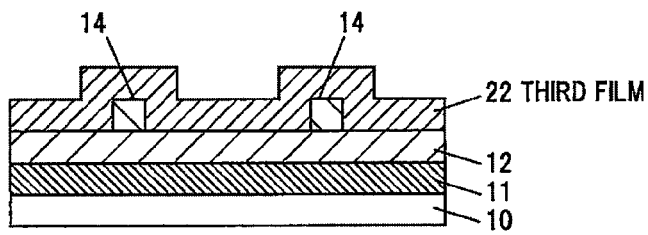
Figure 2E:
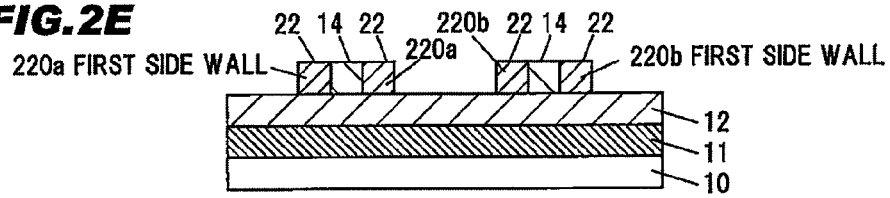
Figure 2F:
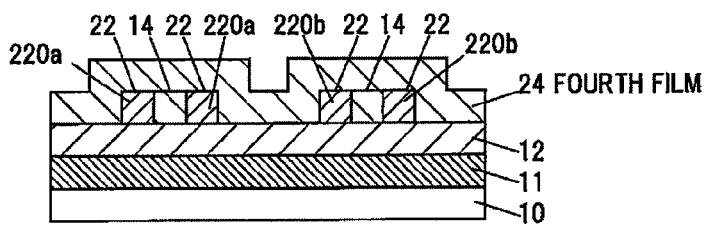
Figure 2G:
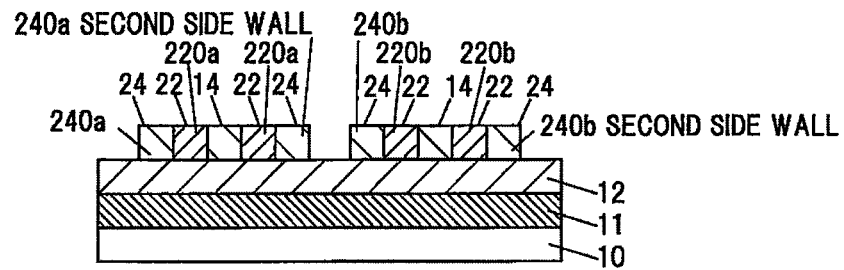
Figure 2H:
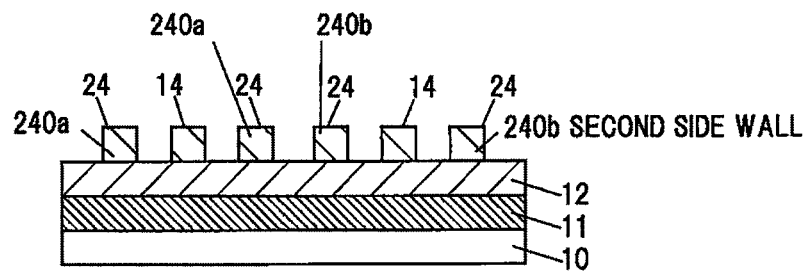
Figure 2I:
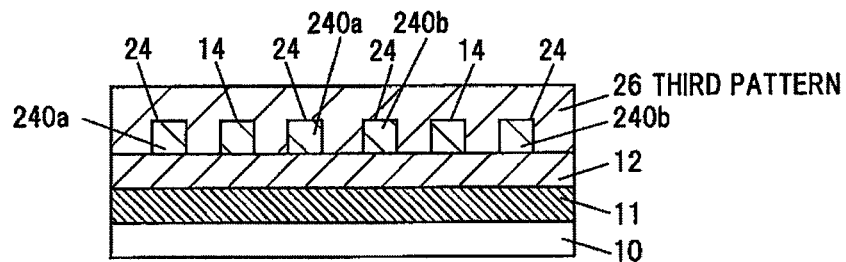
Figure 2J:
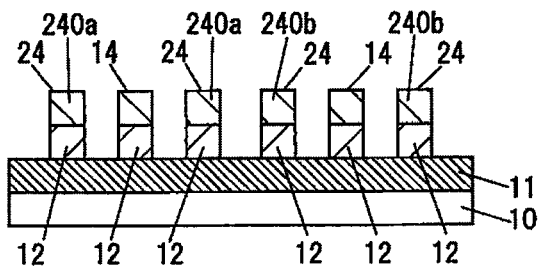
Figure 2K:
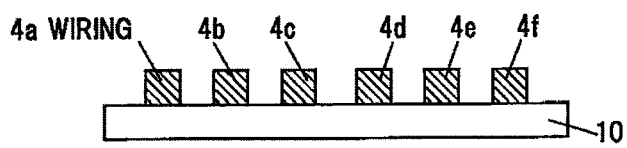
Figure 3G:
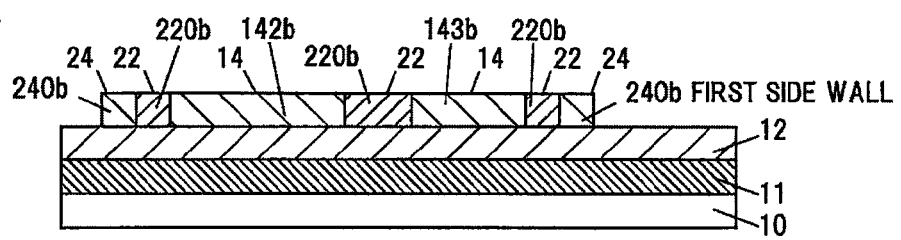
Figure 3H:
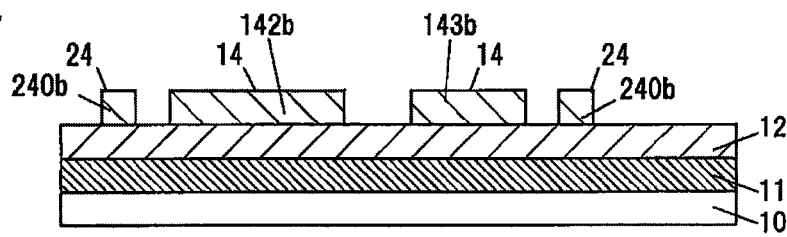
Figure 3I:
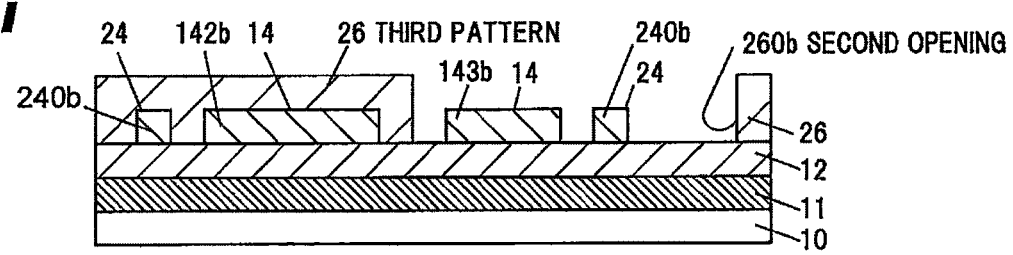
Figure 3J:
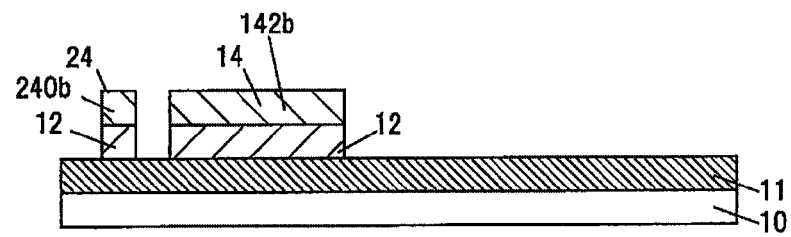
Figure 3K:
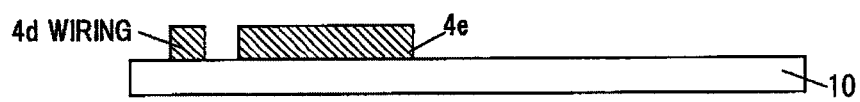

FIGS. 1A to 1K are top views showing one example of a manufacturing process of the semiconductor device according to a first embodiment, FIGS. 2A to 2K are cross-sectional views showing one example of a manufacturing process of the semiconductor device according to the first embodiment and FIGS. 3A to 3K are cross-sectional views showing one example of a manufacturing process of the semiconductor device according to the first embodiment. FIGS. 2A to 2I correspond to cross-sectional views taken along the lines II(a)-II(a) to II(i)-II(i) shown in FIGS. 1A to 1I respectively, and FIGS. 3A to 3I correspond to cross-sectional views taken along the lines III(a)-III(a) to III(i)-III(i) shown in FIGS. 1A to 1I respectively. In addition, FIGS. 2J and 2K correspond to cross-sectional views after a process of FIG. 1I in a cross-section taken along the line II(i)-II(i) in FIGS. 1I. FIGS. 3J and 3K correspond to cross-sectional views after a process of FIG. 1I in a cross-section taken along the line III(i)-III(i) in FIG. 1I.

First, a first film 12 is formed on a semiconductor substrate 10 in which a film to be processed 11 is formed and a second film 14 is formed on the formed first film 12.

As the semiconductor substrate 10, for example, a Si based substrate including Si as a main component or the like is used.

The film to be processed 11 is, for example, a polycrystal Si film, and is formed by a chemical vapor deposition (CVD) method or the like. The film to be processed 11 on an insulating film formed in the semiconductor substrate 10. Further, the insulating film is not shown. The insulating film is, for example, a $SiO_2$ film and is formed by a thermal oxidation method or the like. In addition, the film to be processed 11 can be formed of, for example, not only a single film, but also a plurality of films.

The first film 12 is, for example, a SiN film and is formed by the CVD method or the like.

The second film 14 is, for example, a polycrystal Si film, and is formed by the CVD method or the like. Further, it is preferable that the first film 12 and the second film 14 are formed of a material in which a selection ratio at the time of the etching can be obtained. In case that the second film 14 is a polycrystal Si film, as the first film 12, a C film or the like is used other than the SiN film. Further, the first film 12 can be a film to be processed.

Next, as shown in FIG. 1A, FIG. 2A and FIG. 3A, the formed second film 14 is processed to a pattern 15 including a plurality of linear parts 140A, 140B and end portions 141A, 141B formed in an end of each of the linear parts 140A, 140B, having a width wider than the linear parts 140A, 140B by a photolithography method or the like.

As shown in FIG. 1A, the pattern 15 includes a plurality of line patterns of nearly L-shape formed of the linear part 140A and the end portion 141A, and the linear part 140B and the end portion 141B. The linear parts 140A, 140B are aligned at a pitch (p). A ratio of a line width and a space width of the linear parts 140A, 140B is almost 1:1, and each of the widths is p/2 (hereinafter referred to as "hp"). The line width (hp) is a minimum size due to a design rule of the photolithography method.

As shown in FIG. 1A, the end portion 141A has a rectangular shape, has a width (a1) in a direction almost perpendicular to a longitudinal direction of the linear part 140A, and has a width (b1) in a direction almost parallel to the longitudinal direction. For example, it is preferable that the width (a1) is a width that becomes not less than 1 p after the slimming described below, and the width (b1) is a width that becomes not less than hp after the slimming described below.

In addition, as shown in FIG. 1A, the end portion 141B has a rectangular shape, has a width (a2) in a direction almost perpendicular to a longitudinal direction of the linear part 140B, and has a width (b2) in a direction almost parallel to the longitudinal direction. For example, it is preferable that the width (a2) is a width that becomes not less than 1 p after the slimming described below, and the width (b2) is a width that becomes not less than hp after the slimming described below. Further, a shape of the pattern 15 including the end portions 141A, 141B is not limited to the almost L-shape shown in FIG. 1A.

Next, as shown in FIG. 1B, FIG. 2B and FIG. 3B, the pattern 15 is slimmed so that the line widths of the linear parts 140A, 140B of the formed pattern 15 become a desired width, and a first pattern 16 is formed.

In particular, for example, the pattern 15 is slimmed in a slimming amount of 2 hp/3 so that the line widths of the linear parts 140A, 140B become the desired width (hp/3) by a plasma etching using $Cl_2$, HBr, or $SF_6$. The pattern 15 slimmed is configured to have a width (a3) of the end portion 141a of (a1)-(2 hp/3), a width (b3) of the end portion 141a of (b1)-(2 hp/3), a width (a4) of the end portion 141b of (a2)-(2 hp/3), and a width (b4) of the end portion 141b of (b2)-(2 hp/3). The widths (a3), (a4) are not less than 1 p, and the widths (b3), (b4) are not less than hp.

Further, the first pattern 16 can be also formed, for example, by a method of forming a resist pattern having the same pattern as the pattern 15 on the second film 14, slimming the resist pattern, and transferring the resist pattern slimmed to the second film 14. In addition, as the slimming method, a method based on a plasma etching using $O_2$, a method that a surfaces of the resist pattern is allowed to be alkali soluble by an acidic chemical liquid, a development is carried out by a tetramethylammonium hydroxide (TMAH) aqueous solution and subsequently a pure water rinse treatment is carried out or the like can be used.

Next, a second pattern 18 including a first opening 180 that traverses the end portions 141a, 141b of the first pattern 16 on the second film 14 by the photolithography method.

The first opening 180, for example, has a width of hp in a direction almost perpendicular to the longitudinal direction of the linear parts 140a, 140b slimmed. In addition, the first opening 180, for example, has a distance of not less than 2 hp/3 between an opening edge of the first opening 180 in side of the linear parts 140a, 140b and the linear part 140b nearest to the opening edge. Here, in case that an opening width of the first opening 180 is processed so as to be thinned by a shrink method described below, it can be located at the position in which a distance (c) between the first opening 180 after the width is processed so as to be thinned (an opening 200 described below) and the linear part 140b nearest to the first opening 180 becomes not less than 2 hp/3.

Further, an opening width required for that the first opening 180 divides the end portions 141a, 141b, for example, can be not more than 4 hp/3, that allows a second side wall described below not to be divided. In case that the opening width is not less than hp, it is not needed that the opening width is processed to be thinned after the first opening 180 is formed by the photolithography method, but in case that the opening width is processed to be thinned less than hp by the shrink method, the widths (a3), (a4) of the end portions 141a, 141b can be further reduced, and as a result, an area of a region necessary for forming contacts described below can be decreased.

Next, as shown in FIG. 1C, FIG. 2C and FIG. 3C, an upper layer film 20 is formed on the second pattern 18 and in the first opening 180 by the CVD method or the like and the opening width of the first opening 180 is processed to be thinned by the shrink method, so as to form an opening 200 having a width (d).

The shrink method is, for example, a method that the opening width of the first opening 180 is thinned by that the upper layer film 20 formed of a resolution enhancement lithography assisted by chemical shrink (RELACS) material that is a water-soluble organic material thermally-cured by an acid component remaining in the resist material for forming the second pattern 18 is formed in the on the second pattern 18 and in the first opening 180, after the upper layer film 20 is heat-treated, a pure water treatment is carried out, and an uncured part of the upper layer film 20 is removed. Further, FIG. 1C, FIG. 2C and FIG. 3C show a state before the uncured part of the upper layer film 20 is removed. Here, the upper layer film 20 reacts in only a part thereof formed in a side wall of the first opening 180, and forms a thermosetting layer 201 in the side wall of the first opening 180. This is due to the fact that at the time of light exposure treatment, an upper surface of the second pattern 18 is not exposed, so that even if an after-treatment of the light exposure treatment such as a baking treatment is carried out, the acid component is not diffused. Consequently, when the width (d) targeted of the opening 200 is 2 hp/3, the upper layer film 20 having a thickness of hp/6 is formed, and the upper layer film 20 is heat-treated, so that the thermosetting layer 201 having a width of hp/6 and the opening 200 having the width (d) of 2 hp/3 are formed in the side wall of the first opening 180.

Next, the second film 14 exposed in the opening 200 is etched by the RIE method or the like, and the end portions 141a, 141b are divided into first end portions 142a, 142b close to the linear parts 140a, 140b and second end portions 143a, 143b apart from the linear parts 140a, 140b. Subsequently, the second pattern 18 and the thermosetting layer 201 are removed.

Since the first end portion 142b divided having an area smaller than the first end portion 142a, as described above, has a width (b4) of not less than hp after the slimming and has a distance (c) of not less than 2 hp/3 between the linear part 140b and the first end portion 142b, contacts described below can be formed in an upper layer of it within a design rule of the photolithography method.

Next, as shown in FIG. 1D, FIG. 2D and FIG. 3D, a third film 22 is formed to have the same thickness as the width (hp/3) of the linear parts 140a, 140b so as to cover the first and second films 12, 14 by the CVD method or the like. The third film 22 is, for example, a $SiO_2$ film. It is preferable that the third film 22 is formed of a material in which a selection ratio with respect to the first and second films 12, 14 at the time of the etching can be obtained.

Next, as shown in FIG. 1E, FIG. 2E and FIG. 3E, the third film 22 is etched back by the film thickness thereof by the RIE method or the like, so as to form first side walls 220a, 220b formed of the third film 22 in a side surface of the second film 14.

In particular, the first side wall 220a is formed inside surfaces of the linear part 140a, the first end portion 142a and the second end portion 143a, and the first side wall 220b is formed in side surfaces of the linear part 140b, the first end portion 142b and the second end portion 143b.

Next, as shown in FIG. 1F, FIG. 2F and FIG. 3F, a fourth film 24 is formed to have the same thickness as the width (hp/3) of the linear parts 140a, 140b so as to cover the first to third films 12, 14, 22 by the CVD method or the like. The fourth film 24 is, for example, a polycrystal Si film.

Next, as shown in FIG. 1G, FIG. 2G and FIG. 3G, the fourth film 24 is etched back by the film thickness thereof by the RIE method or the like, so as to form second side walls 240a, 240b formed of the fourth film 24 in side surfaces of the first side walls 220a, 220b so as to form a closed loop pattern sequentially formed around the first end portions 142a, 142b and the second end portions 143a, 143b.

Next, as shown in FIG. 1H, FIG. 2H and FIG. 3H, the first side walls 220a, 220b in whose side surfaces the second side walls 240a, 240b are formed is removed by a wet etching method or the like, and the second films 14 and the second side walls 240a, 240b that are used as masks for patterning the first film 12 are left on the first film 12. Further, the process of removing the first side walls 220a, 220b can be also carried out after the process described below of removing the second side walls 240a, 240b exposed in a second opening and subsequently removing the third pattern.

Next, as shown in FIG. 1I, FIG. 2I and FIG. 3I, the closed loop pattern formed of the second side walls 240a, 240b is divided by the photolithography method.

In particular, a third pattern 26 including second openings 260a, 260b that traverse over the closed loop pattern formed of the second side walls 240a, 240b is formed. Subsequently, the second end portion 143a and the second side wall 240a that are exposed in the second opening 260a, and the second end portion 143b and the second side wall 240b that are exposed in the second opening 260b are removed by the RIE method or the like in which the third pattern 26 is used as a mask. Subsequently, the third pattern 26 is removed. The third pattern 26 is formed of, for example, a resist material.

The second opening 260a, for example, has a rectangular shape extending in a direction almost perpendicular to a longitudinal direction of the linear part 140a, and is formed for the purpose of dividing the closed loop pattern that is formed of the second side wall 240a and surrounds the second end portion 143a, and dividing the second end portion 143a. The second opening 260b has the same shape as the second opening 260a, and is formed for the purpose of dividing the closed loop pattern that is formed of the second side wall 240b and surrounds the second end portion 143b, and dividing the second end portion 143b. Further, the second openings 260a, 260b can have a shape different from each other. In addition, the second openings 260a, 260b are only required to have a size sufficient for at least being capable of dividing the closed loop pattern formed of the second side walls 240a, 240b.

Here, the second end portion 143a is divided into a pattern corresponding to the end portions 145A, 145B described below, and the second end portion 143b is divided into a pattern corresponding to the end portions 145C, 145D described below.

Further, a method of dividing the closed loop pattern in each of the embodiments is not limited to the method described above, for example, a method that the closed loop pattern is divided, the closed loop pattern being formed by that after the first side walls 220a, 220b are removed, the first film 12 is patterned by using the second side walls 240a, 240b as a mask, and a method that the closed loop pattern is divided, the closed loop pattern being formed by that after the first side walls 220a, 220b are removed, the first film 12 is patterned by using the second side walls 240a, 240b as a mask and the film to be processed 11 is patterned by using the first film 12 patterned as a mask, can be also adopted.

Next, as shown in FIG. 2J and FIG. 3J, the first film 12 is patterned by the RIE method or the like in which the second film 14 and the second side walls 240a, 240b that are left on the first film 12 are used as a mask.

Next, as shown in FIG. 2K and FIG. 3K, the film to be processed 11 is patterned by the RIE method or the like in which the second film 14 and the second side walls 240a, 240b, and the first film 12 that are left on the film to be processed 11 are used as a mask, and the second film 14 and the second side walls 240a, 240b, and the first film 12 are removed. The film to be processed 11 is patterned, so that wirings 4a to 4f formed of the film to be processed 11 are formed. The linear parts of the wirings 4a to 4f form a line and space pattern in which a line width and a space width have a width of hp/3 that is smaller than an exposure light resolution limit.

Next, an interlayer insulating film 28 is formed so as to cover the film to be processed 11 by the CVD method or the like.

The interlayer insulating film 28 is formed of, for example, a Si oxide such as a $SiO_2$, a SiOC, and an organic insulating film such as a SiOCH, a polymethylsiloxane.

Next, as shown in FIG. 1J, a fourth pattern 30 including openings 300a to 300f corresponding to the contacts 32a to 32f described below is formed on the interlayer insulating film 28 by the photolithography method.

The opening 300a is formed in an upper layer of the wiring 4a and the end portion 145A. The opening 300b is formed in an upper layer of the first end portion 142A of the wiring 4b. The opening 300c is formed in an upper layer of the wiring 4c and the end portion 145B. The opening 300d is formed in an upper layer of the wiring 4d and the end portion 145C. The opening 300e is formed in an upper layer of the first end portion 142B of the wiring 4e. The opening 300f is formed in an upper layer of the wiring 4f and the end portion 145D. The openings 300a to 300f are formed so as to have a distance of not less than hp between each other. Further, the first end portions 142A, 142B shown in FIG. 1J are obtained by that the first end portions 142a, 142b in the second film 14 are transferred to the film to be processed 11.

Next, the interlayer insulating film 28 exposed in the openings 300a to 300f is etched by the RIE method or the like.

In particular, by the RIE method or the like, the wiring 4a and the end portion 145A are exposed in the opening 300a, the wiring 4b is exposed in the opening 300b, the wiring 4c and the end portion 145B are exposed in the opening 300c, the wiring 4d and the end portion 145C are exposed in the opening 300d, the wiring 4e is exposed in the opening 300e, and the wiring 4f and the end portion 145D are exposed in the opening 300f. Subsequently, the fourth pattern 30 is removed.

Next, as shown in FIG. 1K, a metal film is formed on the interlayer insulating film 28 and in the openings 300a to 300f by a sputtering method or the like, the metal film on the interlayer insulating film 28 is removed by a chemical mechanical polishing (CMP) method or the like so that the contacts 32a to 32f to be connected to the wirings 4a to 4f are formed, and subsequently, via well-known processes, a desired semiconductor device is obtained.

As the metal film forming the contacts 32a to 32f, for example, a metal material such as Mg, W, Al, Cu, Ag, Ti, Mo, Cd, Zn, Co, Ni, Au, Rh, Fe can be used. The contacts 32a to 32f are formed so as to have a distance of not less than hp between each other.

Advantages of First Embodiment

In accordance with the first embodiment, the following advantages can be obtained.
(1) The end portions 141a, 141b of the second film 14 are divided into the first end portions 142a, 142b and the second end portions 143a, 143b, so that the contacts 32a to 32f to be connected to the wirings 4a to 4f can be easily formed in comparison with a case that the end portions 141a, 141b of the second film 14 are not divided. In particular, the contacts 32a, 32c, 32d, 32f to be connected to the wirings 4a, 4c, 4d, 4f having a width of hp/3 can be easily formed.
(2) The opening 200 after the shrink treatment for dividing the end portions 141a, 141b is located at a position where the distance (c) from the linear part 140b of the end portion 141b that has a particularly small area becomes not less than 2 hp/3, so that the contact 32e can be easily formed in the first end portion 142b located in a side of the linear part 140b after the end portion 141b is divided, in comparison with a case that the distance (c) is less than 2 hp/3.
(3) The end portions 141a, 141b of the second film 14 can be divided based on a single opening 200 formed in the second pattern 18, so that the semiconductor device can be easily manufactured, in comparison with a case that it can not be divided based on a single opening.

Second Embodiment

Hereinafter, a second embodiment will be explained. Further, in each of the embodiments described below, to the same elements in compositions and functions as those of the first embodiment, the same references as used in the first embodiment will be used, and detail explanation will be omitted.
(Manufacturing Method of Semiconductor Device)

Figure 4A:
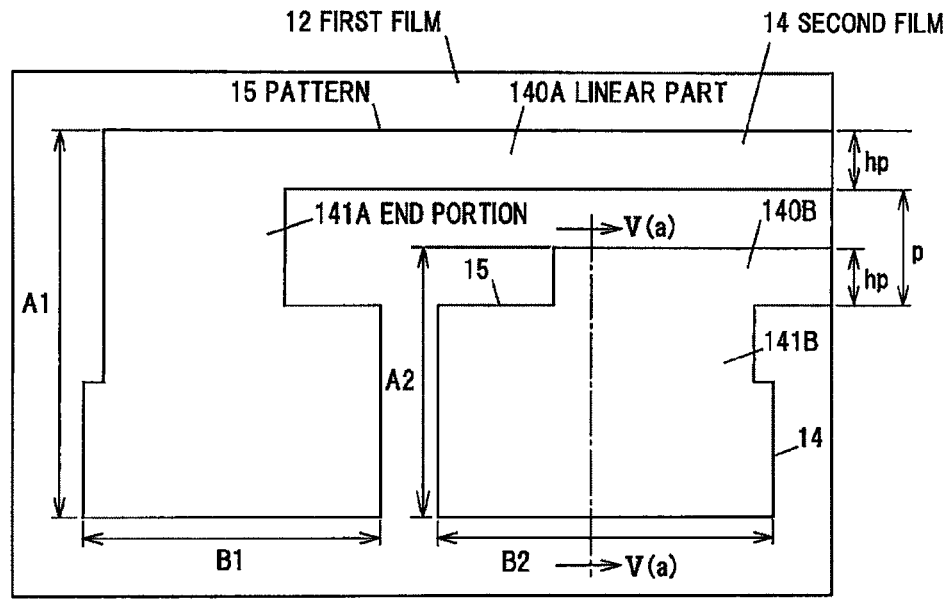
FIGS. 4A to 4K are top views showing one example of a manufacturing process of the semiconductor device according to a second embodiment.
Figure 4B:
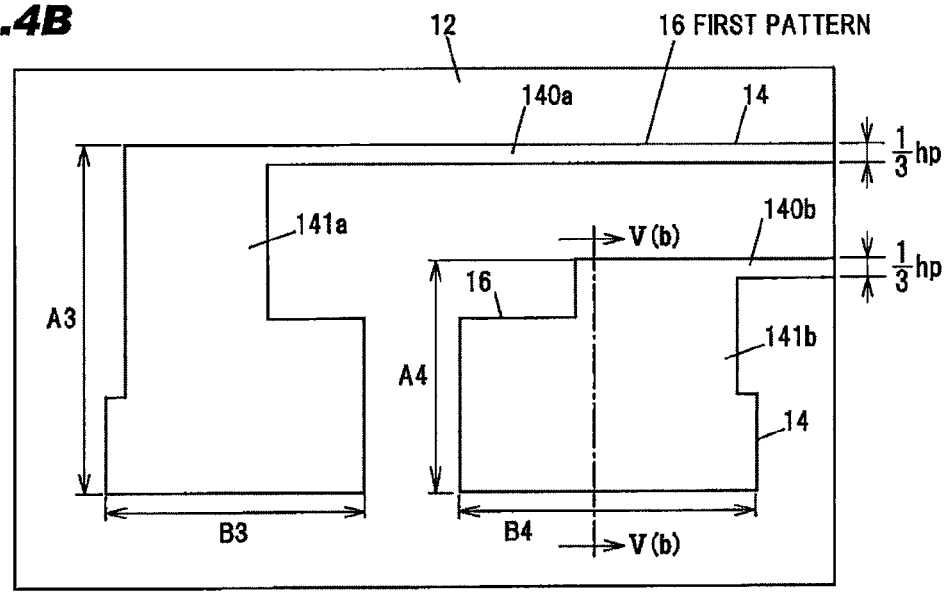
Figure 4C:
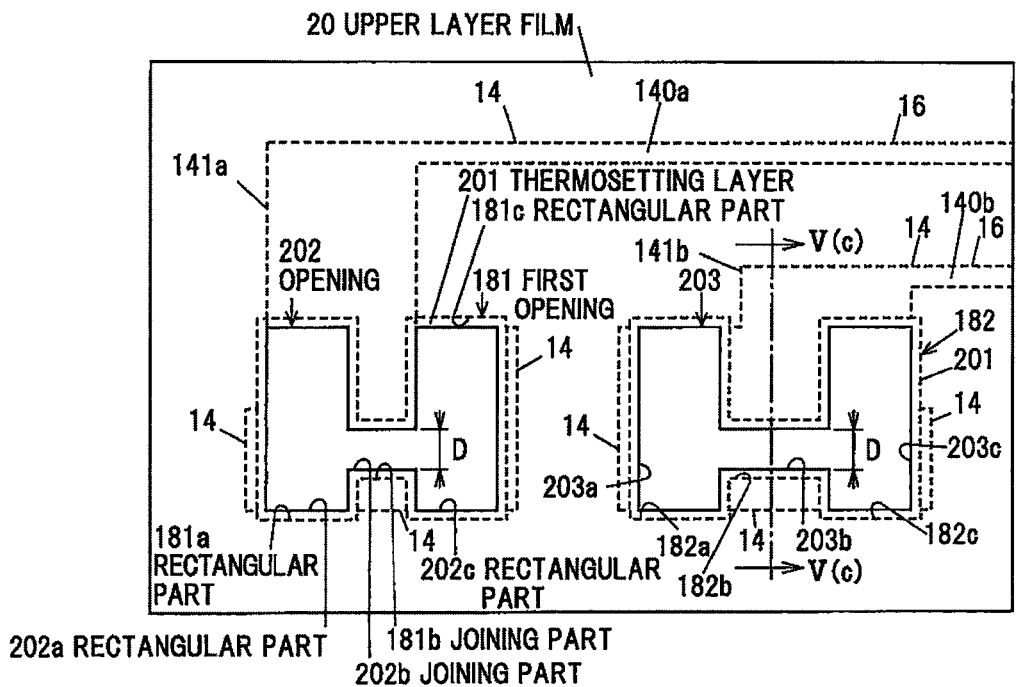
Figure 4D:
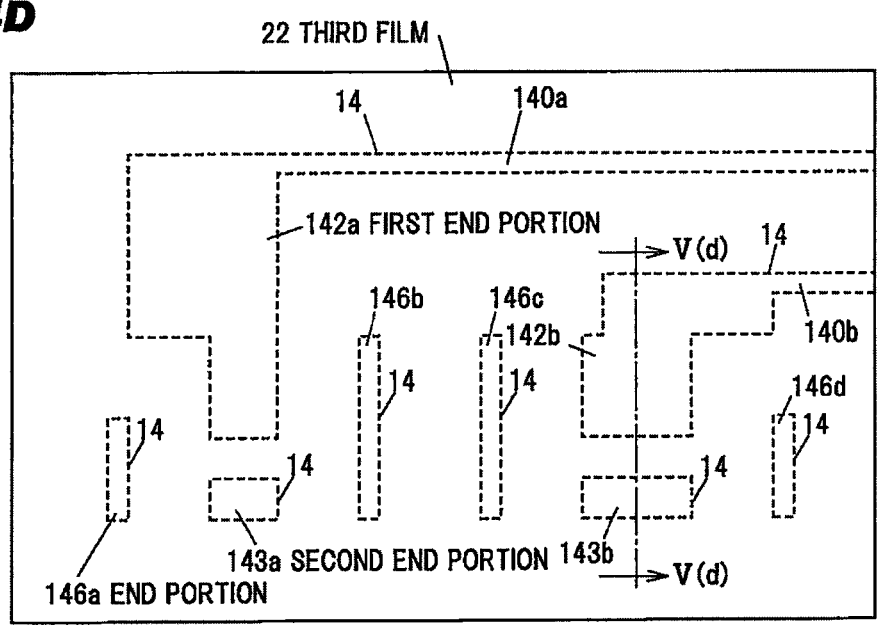
Figure 4E:
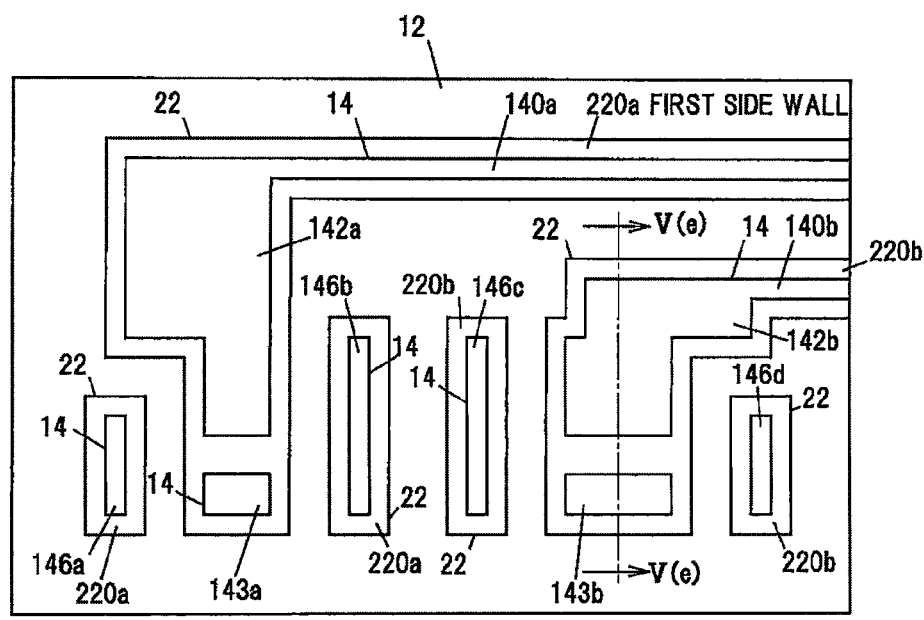
Figure 4F:
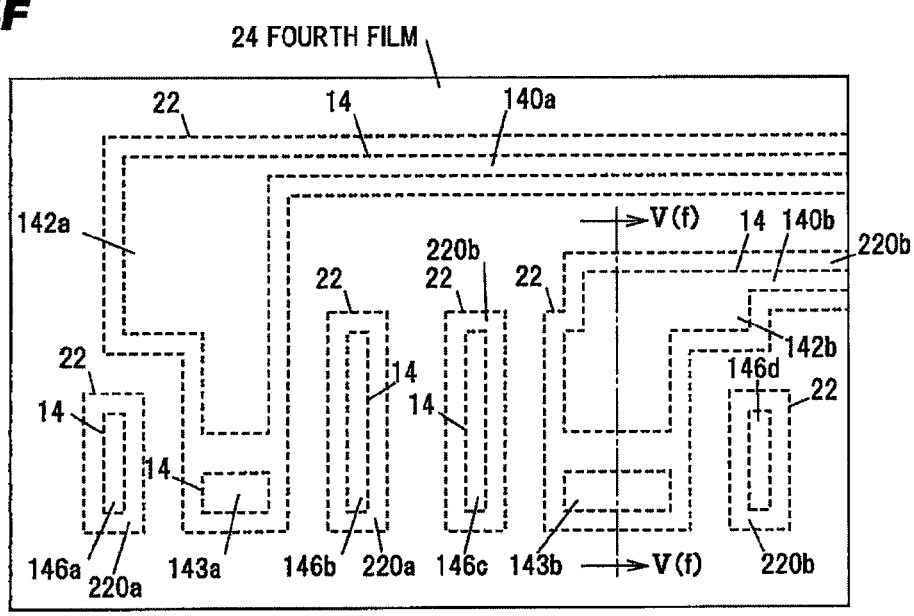
Figure 4G:
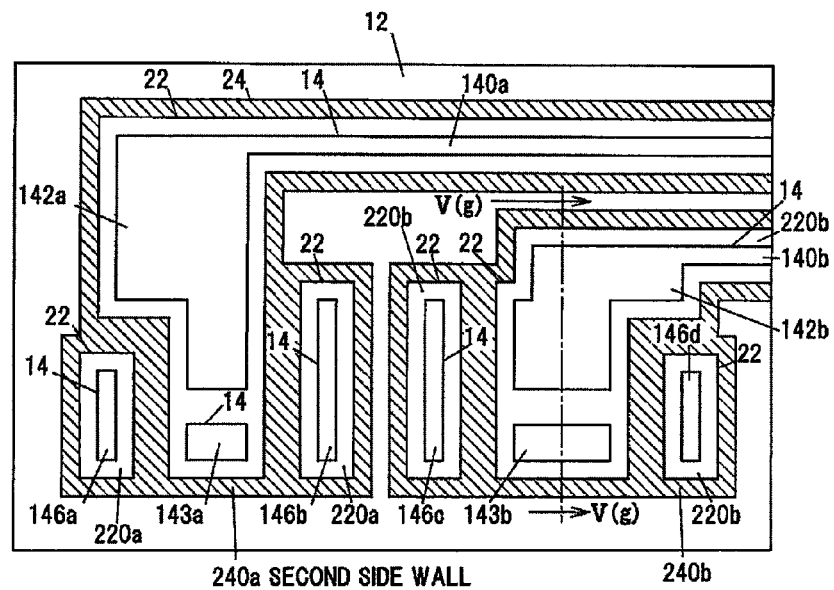
Figure 4H:
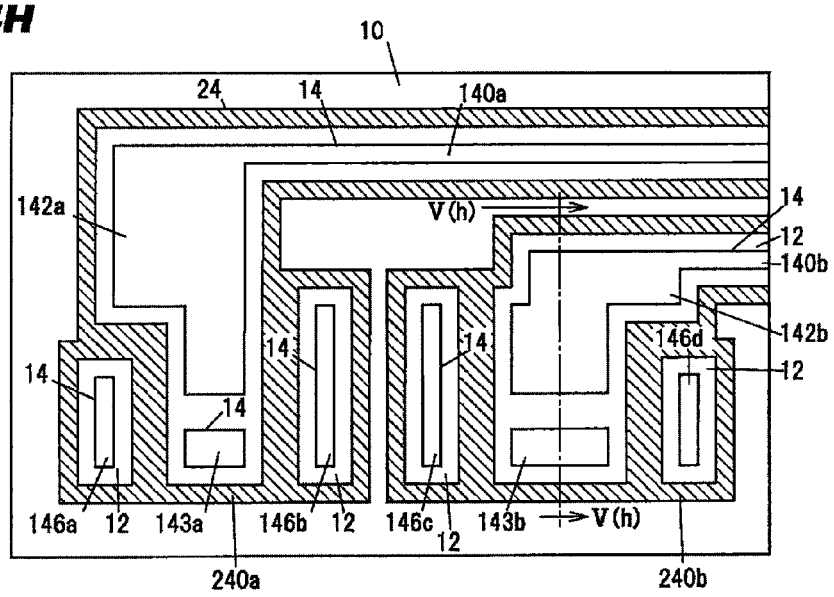
Figure 4I:
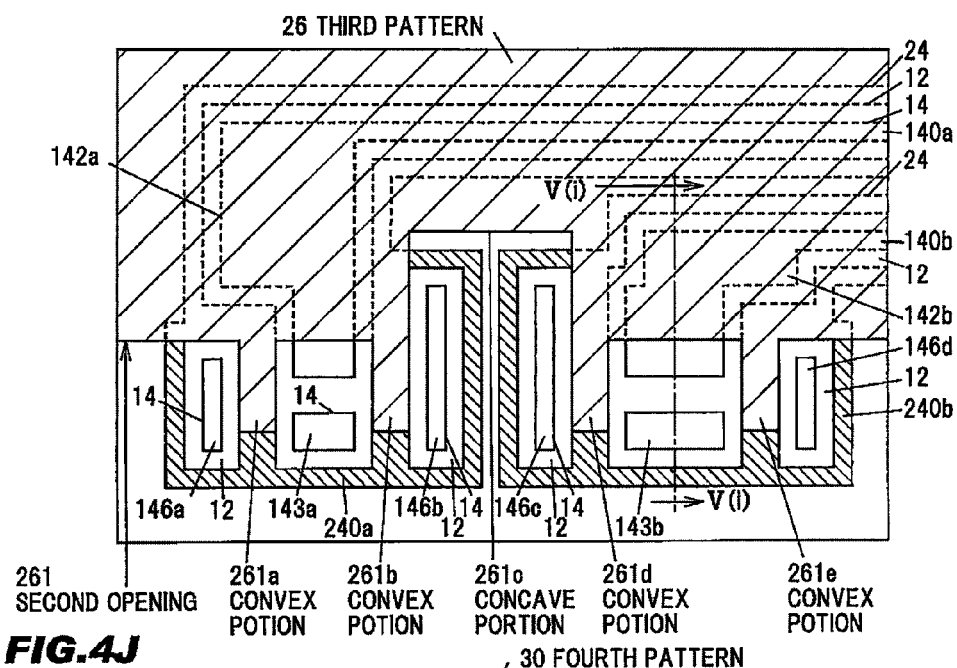

FIGS. 4A to 4K are top views showing one example of a manufacturing process of the semiconductor device according to a second embodiment, and FIGS. 5A to 5K are cross-sectional views showing one example of a manufacturing process of the semiconductor device according to the second embodiment. FIGS. 5A to 5I correspond to cross-sectional views taken along the lines V(a)-V(a) to V(i)-VI(i) shown in FIGS. 4A to 4I respectively, and FIGS. 5J and 5K correspond to cross-sectional views after a process of FIG. 4I in a cross-section taken along the line V(i)-V(i) in FIG. 4I. Further, the third pattern 26 in FIG. 4I is hatched.

First, a first film 12 is formed on a semiconductor substrate 10 in which a film to be processed 11 is formed and a second film 14 is formed on the formed first film 12.

Figure 5A:
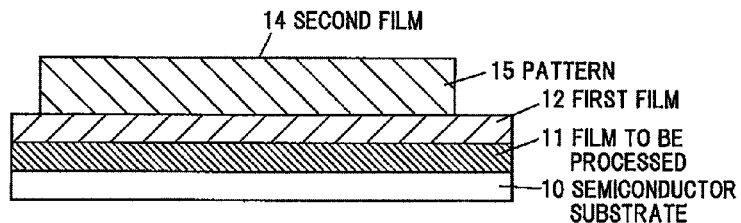
FIGS. 5A to 5K are cross-sectional views showing one example of a manufacturing process of the semiconductor device according to the second embodiment.

Next, as shown in FIG. 4A, and FIG. 5A, the formed second film 14 is processed to a pattern 15 including a plurality of linear parts 140A, 140B and end portions 141A, 141B formed in an end of each of the linear parts 140A, 140B, having a width wider than the linear parts 140A, 140B by a photolithography method.

As shown in FIG. 4A, the pattern 15 includes a plurality of line patterns of nearly L-shape formed of the linear part 140A and the end portion 141A, and the linear part 140B and the end portion 141B. The linear parts 140A, 140B are aligned at a pitch (p). A ratio of a line width and a space width of the linear parts 140A, 140B is almost 1:1, and each of the widths is hp.

As shown in FIG. 4A, the end portion 141A has a width (A1) in a direction almost perpendicular to a longitudinal direction of the linear part 140A, and has a width (B1) in a direction almost parallel to the longitudinal direction. In the embodiment, the width (A1) is, for example, 20 hp/3, and the width (B1) is, for example, 15 hp/3.

As shown in FIG. 4A, the end portion 141B has a width (A2) in a direction almost perpendicular to a longitudinal direction of the linear part 140B, and has a width (B2) in a direction almost parallel to the longitudinal direction. In the embodiment, the width (A2) is, for example, 14 hp/3, and the width (B2) is, for example, 17 hp/3.

Figure 5B:
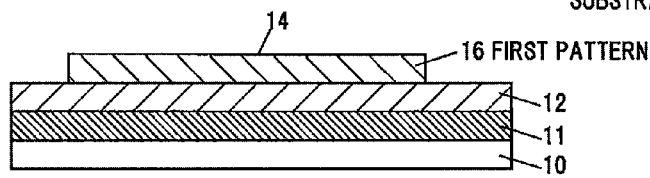

Next, as shown in FIG. 4B and FIG. 5B, the pattern 15 is slimmed so that the line widths of the linear parts 140A, 140B of the formed pattern 15 become hp/3, and a first pattern 16 is formed. As the slimming method, this embodiment uses the same method as the first embodiment.

A width (A3) of the end portion 141A after the slimming is 18 hp/3, and a width (B3) is 13 hp/3. In addition, a width (A4) of the end portion 141B after the slimming is 12 hp/3, and a width (B4) is 15 hp/3.

Next, a second pattern 18 including first openings 181, 182 that traverses the end portions 141a, 141b of the first pattern 16 is formed on the second film 14 by the photolithography method.

The first opening 181 includes two rectangular parts 181a, 181c extending in a direction almost perpendicular to the linear part 140a and having a rectangular shape, and a joining part 181b extending in a direction almost parallel to the linear part 140a and having a rectangular shape, and has an almost H shape that the joining part 181b is sandwiched between the rectangular parts 181a, 181c.

In addition, the first opening 182 includes a rectangular part 182a, a joining part 182b and a rectangular part 182c that are similar to the rectangular part 181a, the joining part 181b and the rectangular part 181c.

The joining part 181b has, for example, a width of hp in a direction almost perpendicular to a longitudinal direction of the linear part 140a. In addition, the joining part 182b has a width of hp in a direction almost perpendicular to a longitudinal direction of the linear part 140b, similarly to the joining part 181b.

Figure 5C:
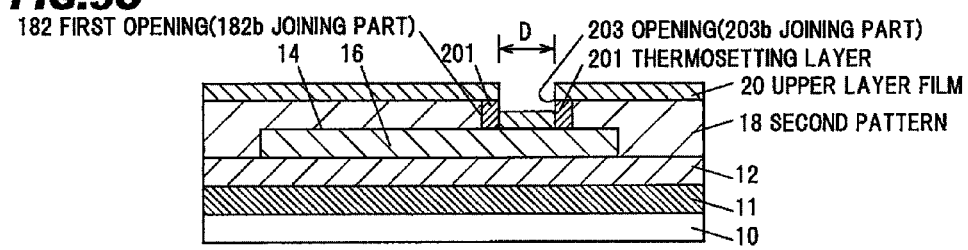

Next, as shown in FIG. 4C and FIG. 5C, an upper layer film 20 is formed on the second pattern 18 and in the first openings 181, 182 by the CVD method or the like and the opening width of the first openings 181, 182 is processed to be thinned by the shrink method, so as to form openings 202, 203.

As shown in FIG. 4C and FIG. 5C, the openings 202, 203 have a shape corresponding to the shape of first openings 181, 182 reduced in size, due to the fact that the thermosetting layer 201 is formed in the side surfaces. After the shrink method is carried out similarly to the first embodiment, the rectangular parts 181a, 181c and the joining part 181b of the first opening 181 form the rectangular parts 202a, 202c and the joining part 202b respectively, and the rectangular parts 182a, 182c and the joining part 182b of the first opening 182 form the rectangular parts 203a, 203c and the joining part 203b respectively.

The joining parts 202b, 203b have, for example, the same width (D) in a direction almost perpendicular to the longitudinal direction of the linear parts 140a, 140b, and the width (D) is 2 hp/3.

It is preferable that the openings 202, 203 have, for example, widths of not less than 11 hp/3 and not less than 13 hp/3 respectively in a direction almost parallel to the longitudinal direction of the linear parts 140a, 140b. In the embodiment, if the openings 202, 203 have the widths of less than 11 hp/3 and less than 13 hp/3 respectively, it becomes difficult to form the contacts to be connected to the wirings formed around the first end portions 142a, 142b in a subsequent process.

In addition, it is preferable that the rectangular parts 202a, 202c, 203a, 203c have a width of 4 hp/3 respectively in a direction almost parallel to the longitudinal direction of the linear parts 140a, 140b.

Next, the second film 14 exposed in the openings 202, 203 is etched by the RIE method or the like, and the end portions 141a, 141b are divided into first end portions 142a, 142b close to the linear parts 140a, 140b, and second end portions 143a, 143b apart from the linear parts 140a, 140b, and further end portions 146a to 146d remaining in sides of the second end portions 143a, 143b and apart from the linear parts 140a, 140b. Subsequently, the second pattern 18 and the thermosetting layer 201 are removed.

Figure 5D:
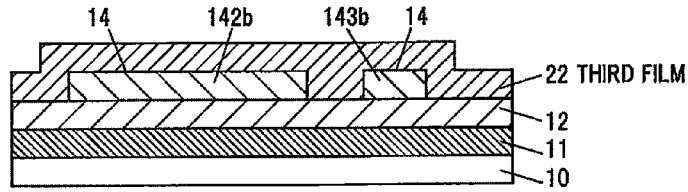

Next, as shown in FIG. 4D and FIG. 5D, a third film 22 is formed to have the same thickness as the width (hp/3) of the linear parts 140a, 140b so as to cover the first and second films 12, 14 by the CVD method or the like.

Figure 5E:
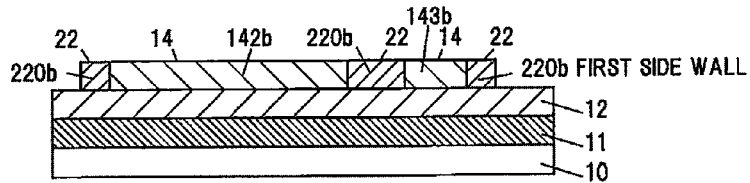

Next, as shown in FIG. 4E and FIG. 5E, the third film 22 is etched back by the film thickness thereof by the RIE method or the like, so as to form first side walls 220a, 220b formed of the third film 22 in a side surface of the second film 14.

In particular, the first side wall 220a is formed in side surfaces of the linear part 140a, the first end portion 142a, the second end portion 143a and the end portions 146a, 146b, and the first side wall 220b is formed in side surfaces of the linear part 140b, the first end portion 142b, the second end portion 143b and the end portions 146c, 146d.

Here, a distance between the first end portion 142a and the second end portion 143a, and a distance between the first end portion 142b and the second end portion 143b are 2 hp/3 respectively, so that as shown in FIG. 5E, the third film 22 deposited so as to have a thickness of hp/3 is embedded with no space.

Figure 5F:
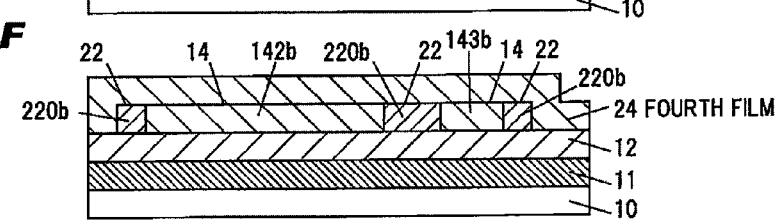

Next, as shown in FIG. 4F and FIG. 5F, a fourth film 24 is formed to have the same thickness as the width (hp/3) of the linear parts 140a, 140b so as to cover the first to third films 12, 14, 22 by the CVD method or the like.

Figure 5G:
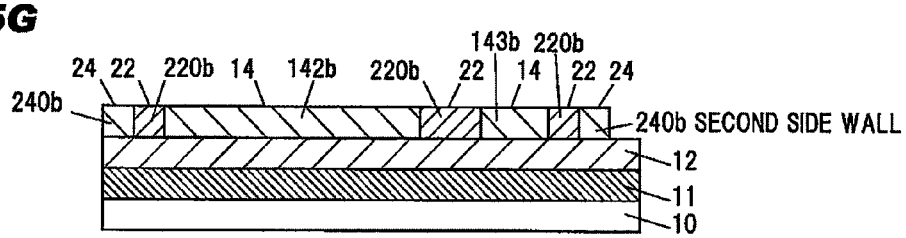

Next, as shown in FIG. 4G and FIG. 5G, the fourth film 24 is etched back by the film thickness thereof by the RIE method or the like, so as to form second side walls 240a, 240b formed of the fourth film 24 in side surfaces of the first side walls 220a, 220b so as to form a closed loop pattern sequentially formed around the first end portions 142a, 142b, the second end portions 143a, 143b and the end portions 146a to 146d.

Figure 5H:
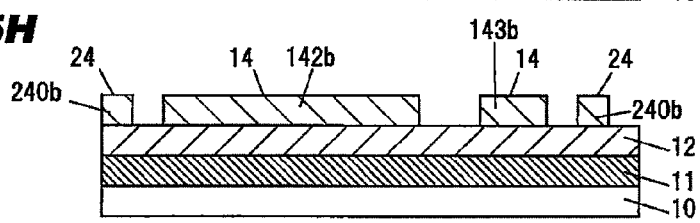

Next, as shown in FIG. 4H and FIG. 5H, the first side walls 220a, 220b in whose side surfaces the second side walls 240a, 240b are formed is removed by a wet etching method or the like, and the second films 14 and the second side walls 240a, 240b that are used as masks for patterning the first film 12 are left on the first film 12.

Figure 5I:
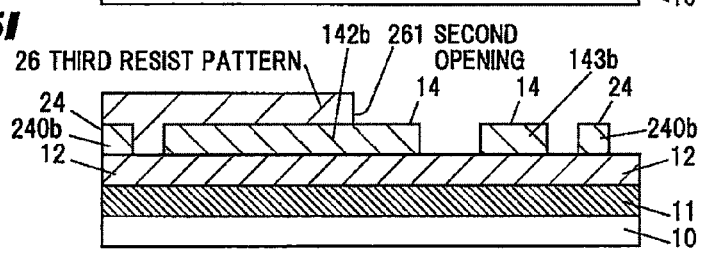

Next, as shown in FIG. 4I and FIG. 5I, the closed loop pattern of the second side walls 240a, 240b is divided by the photolithography method.

In particular, the third pattern 26 including a second opening 261 is formed so as to cover the first film 12, the second film 14 and the fourth film 24. The second opening 26 is formed for the purpose of dividing the closed loop pattern that surrounds the second end portion 143a and the end portions 146a, 146b formed of the second side walls 240a and dividing the closed loop pattern that surrounds the second end portion 143b and the end portions 146c, 146d formed of the second side walls 240b, and is formed for the purpose of removing the second end portions 143a, 143b and the end portions 146a to 146d.

The second opening 261 includes convex potions 261a, 261b, a concave portion 261c, and convex potions 261d, 261e.

The convex potion 261a is formed on the second side wall 240a between the end portion 146a and the second end portions 143a and has a width, for example, of 2 hp/3.

The convex potion 261b is formed on the second side wall 240a between the second end portions 143a and the end portion 146b and has a width, for example, of 2 hp/3. In addition, a part of the forward end of the first end portion 142a and the second end portions 143a are exposed between the convex potion 261a and the convex potion 261b.

The concave portion 261c is formed between the convex potion 261b and the convex portion 261d, and the end portions 146b, 146c and the second side walls 240a, 240b formed around the end portions 146b, 146c are exposed.

The convex potion 261d is formed on the second side wall 240b between the second end portions 143b and the end portion 146c, and has a width, for example, of 2 hp/3.

The convex potion 261e is formed on the second side wall 240b between the second end portions 143b and the end portion 146d and has a width, for example, of 2 hp/3. In addition, a part of the forward end of the first end portion 142b and the second end portions 143b are exposed between the convex potion 61d and the convex potion 261e.

Next, the second side walls 240a, 240b, the second end portions 143a, 143b and the end portions 146a to 146d that are exposed in the second opening 261 are removed by the RIE method or the like in which the third pattern 26 is used as a mask. Subsequently, the third pattern 26 is removed.

Figure 5J:
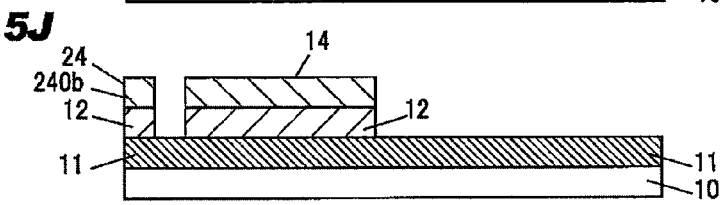

Next, as shown in FIG. 5J, the first film 12 is patterned by the RIE method or the like in which the second film 14 and the second side walls 240a, 240b that are left on the first film 12 are used as a mask.

Figure 5K:
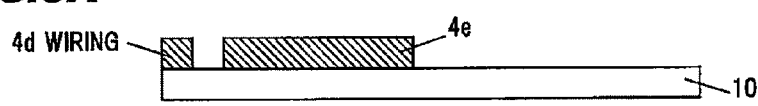

Next, as shown in FIG. 5K, the film to be processed 11 is patterned by the RIE method or the like in which the second film 14 and the second side walls 240a, 240b, and the first film 12 that are left on the film to be processed 11 are used as a mask, and the second film 14 and the second side walls 240a, 240b, and the first film 12 are removed. The film to be processed 11 is patterned, so that wirings 4a to 4f formed of the film to be processed 11 are formed. The linear parts of the wirings 4a to 4f form a line and space pattern in which a line width and a space width have a width of hp/3 that is smaller than an exposure light resolution limit.

Next, an interlayer insulating film 28 is formed so as to cover the film to be processed 11 by the CVD method or the like.

Figure 4J:
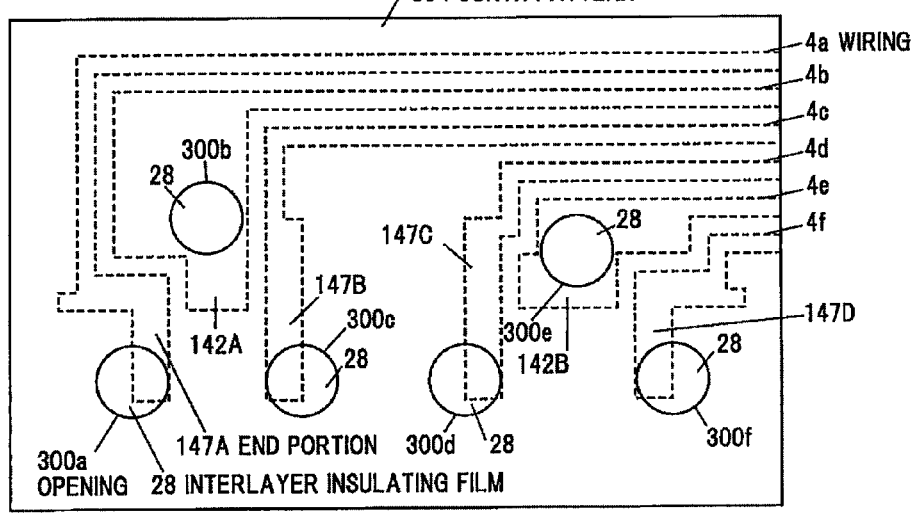

Next, as shown in FIG. 4J, a fourth pattern 30 including openings 300a to 300f corresponding to the contacts 32a to 32f is formed on the interlayer insulating film 28 by the photolithography method.

The opening 300a is formed in an upper layer of the end portion 147A of the wiring 4a. The opening 300b is formed in an upper layer of the first end portion 142A of the wiring 4b. The opening 300c is formed in an upper layer of the end portion 147B of the wiring 4c. The opening 300d is formed in an upper layer of the end portion 147C of the wiring 4d. The opening 300e is formed in an upper layer of the first end portion 142B of the wiring 4e. The opening 300f is formed in an upper layer of the end portion 147D of the wiring 4f. The openings 300a to 300f are formed so as to have a distance of not less than hp between each other. Further, the first end portions 142A, 142B shown in FIG. 4J are obtained by that the first end portions 142a, 142b after the closed loop is divided are transferred to the film to be processed 11.

Next, the interlayer insulating film 28 exposed in the openings 300a to 300f is etched by the RIE method or the like. Subsequently, the fourth pattern 30 is removed.

Figure 4K:
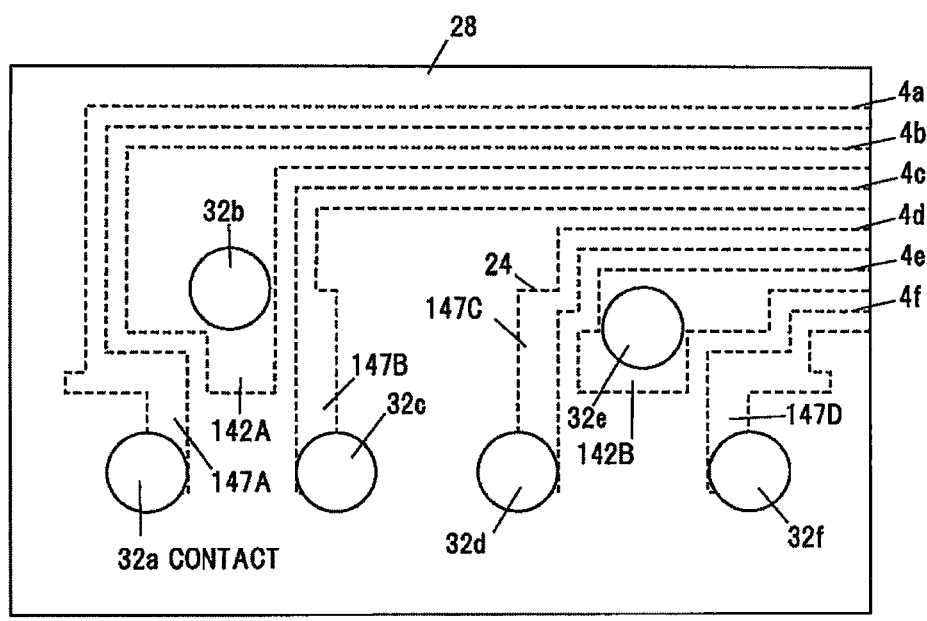

Next, as shown in FIG. 4K, a metal film is formed on the interlayer insulating film 28 and in the openings 300a to 300f by a sputtering method or the like, the metal film on the interlayer insulating film 28 is removed by the CMP method or the like so that the contacts 32a to 32f are formed, and subsequently, via well-known processes, a desired semiconductor device is obtained.

Advantages of Second Embodiment

In accordance with the second embodiment, the second embodiment can have a greater deal of arbitrary property in a layout of the contacts, in comparison with the first embodiment.

Third Embodiment

Hereinafter, a third embodiment will be explained. The third embodiment is different from the above-mentioned first embodiment in which the end portions are divided in an almost perpendicular direction, in that the end portions are divided in an almost parallel direction to a longitudinal direction of the linear parts by using openings obtained by that the opening width of the first openings is thinned by the shrink method.

(Manufacturing Method of Semiconductor Device)

Figure 6A:
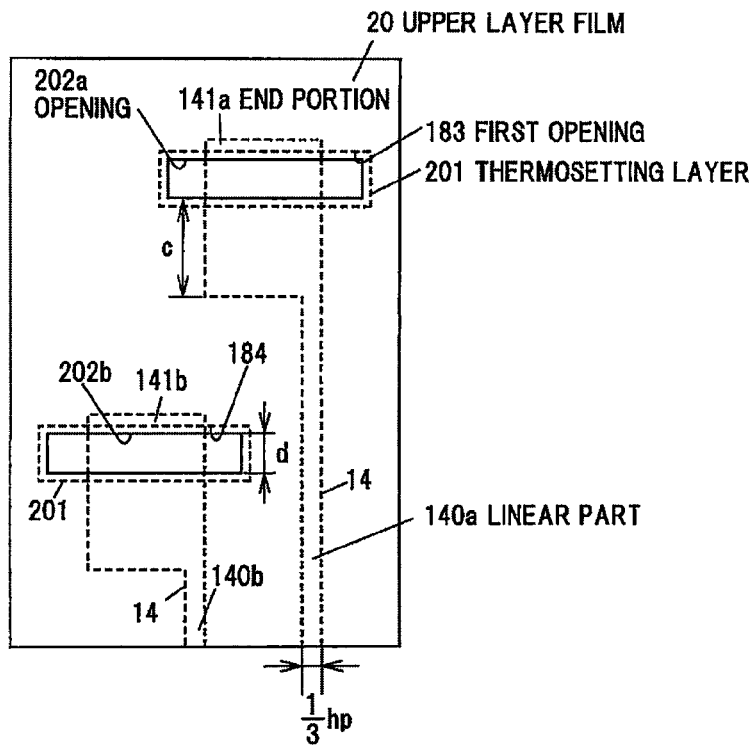
FIGS. 6A to 6C are top views showing one example of a manufacturing process of the semiconductor device according to a third embodiment.
Figure 6B:
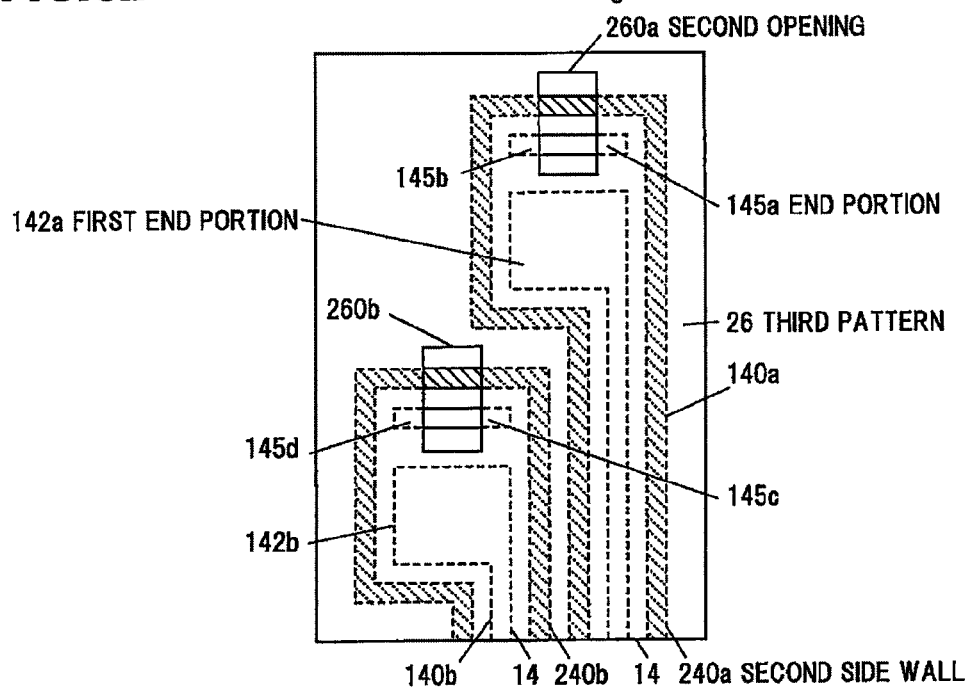
Figure 6C:
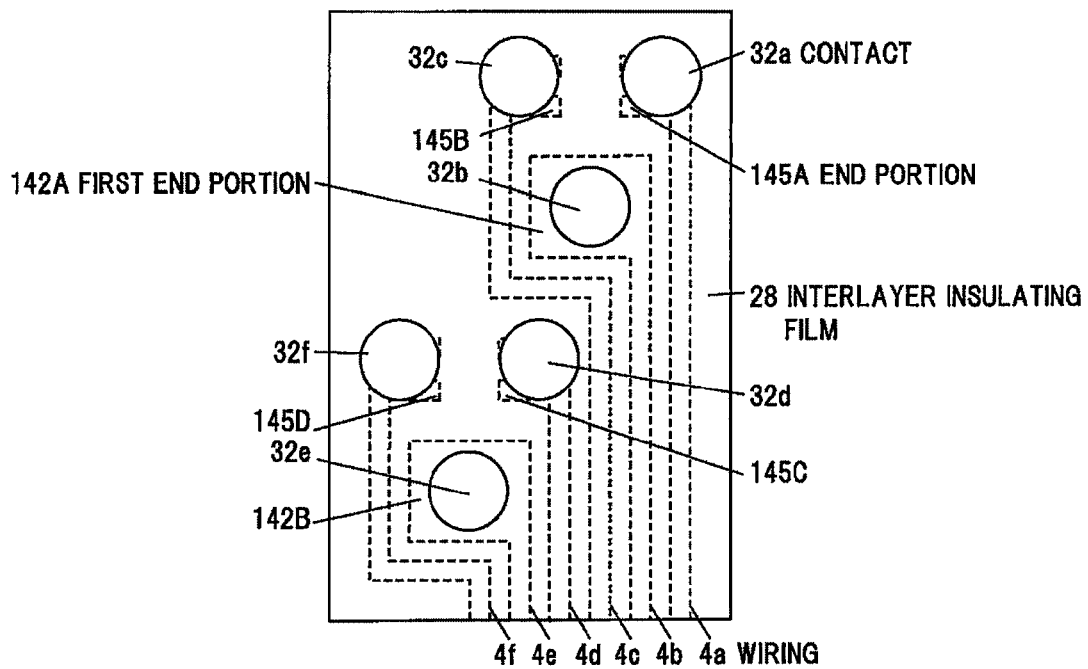

FIGS. 6A to 6C are top views showing one example of a manufacturing process of the semiconductor device according to a third embodiment. Further, a manufacturing method of a semiconductor device according to the third embodiment has many common parts with the manufacturing method of a semiconductor device according to the first embodiment except for parts due to the fact that the end portions 141a, 141b have shapes different from the end portions of the first embodiment, so that it will be explained with reference to the process drawings in the first embodiment partially.

First, a first film 12 is formed on a semiconductor substrate 10 in which a film to be processed 11 is formed and a second film 14 is formed on the formed first film 12.

Next, the formed second film 14 is processed to a pattern 15 including a plurality of linear parts 140A, 140B and end portions 141A, 141B formed in an end of each of the linear parts 140A, 140B, having a width wider than the linear parts 140A, 140B by a photolithography method (for example, refer to FIG. 1A).

The pattern 15 includes a plurality of line patterns formed of the linear parts 140A, 140B and the end portions 141A, 141B. The line patterns are aligned at a pitch (p), and a ratio of a line width and a space width of the linear parts 140A, 140B is almost 1:1, and each of the widths is hp.

It is preferable that the end portions 141A, 141B have a rectangular shape, have a width of not less than 1 p in an almost parallel direction to a longitudinal direction of the linear parts 140A, 140B after the slimming, and have a width of not less than hp in an almost perpendicular direction to the longitudinal direction.

Next, the pattern 15 is slimmed so that the line widths of the linear parts of the formed pattern 15 become hp/3, and the first pattern 16 is formed (for example, refer to FIG. 1B).

Next, a second pattern 18 including a first opening 183 that traverses the end portion 141a of the first pattern 16 and a first opening 184 that traverses the end portion 141b is formed on the second film 14 by the photolithography method.

The first openings 183, 184, for example, has a width of hp in a direction almost parallel to the longitudinal direction of the linear parts 140a, 140b. In addition, the first openings 183, 184, for example, have a distance of not less than 2 hp/3 from the end portions of the linear parts 140a, 140b to the opening edges in side of the linear parts 140a, 140b. Here, in case that opening widths of the first openings 183, 184 are processed so as to be thinned by the shrink method, the first openings 183, 184 can be located at the position in which a distance (c) between the first openings 183, 184 after the width is processed so as to be thinned, namely the openings 202a, 202b and the linear parts 140a, 140b nearest to the first openings 183, 184 becomes not less than 2 hp/3.

Next, as shown in FIG. 6A, an upper layer film 20 is formed on the second pattern 18 and in the first openings 183, 184 by the CVD method or the like, and the opening widths of the first openings 183, 184 is processed to be thinned by forming the thermosetting layer 201 by the shrink method, so as to form the openings 202a, 202b having a width (d) of 2 hp/3 in an almost parallel direction to the linear parts 140a, 140b.

Next, the second film 14 exposed in the openings 202a, 202b is etched by the RIE method or the like, and the end portions 141a, 141b are divided into first end portions 142a, 142b close to the linear parts 140a, 140b, and second end portions 143a, 143b apart from the linear parts 140a, 140b. Subsequently, the second pattern 18 and the thermosetting layer 201 are removed.

Next, a third film 22 is formed to have the same thickness as the width (hp/3) of the linear parts 140a, 140b so as to cover the first film 12 and the second film 14 by the CVD method or the like (for example, refer to FIG. 1D).

Next, the third film 22 is etched back by the film thickness thereof by the RIE method or the like, so as to form first side walls 220a, 220b formed of the third film 22 in a side surface of the second film 14 (for example, refer to FIG. 1E).

Next, a fourth film 24 is formed to have the same thickness as the width (hp/3) of the linear parts 140a, 140b so as to cover the first to third films 12, 14, 22 by the CVD method or the like (for example, refer to FIG. 1F).

Next, the fourth film 24 is etched back by the film thickness thereof by the RIE method or the like, so as to form second side walls 240a, 240b formed of the fourth film 24 in side surfaces of the first side walls 220a, 220b so as to form a closed loop pattern sequentially formed around the first end portions 142a, 142b and the second end portions 143a, 143b (for example, refer to FIG. 1G).

Next, the first side walls 220a, 220b in whose side surfaces the second side walls 240a, 240b are formed is removed by a wet etching method or the like, and the second films 14 and the second side walls 240a, 240b that are used as masks for patterning the first film 12 are left on the first film 12 (for example, refer to FIG. 1H).

Next, as shown in FIG. 6B, the closed loop pattern of the second side walls 240a, 240b is divided by the photolithography method.

In particular, the third pattern 26 including second openings 260a, 260b that traverse over the closed loop pattern formed of the second side walls 240a, 240b is formed. The second opening 260a, for example, has a rectangular shape extending in a direction almost parallel to a longitudinal direction of the linear part 140a, and is formed for the purpose of dividing the closed loop pattern that is formed of the second side wall 240a and surrounds the second end portion 143a, and dividing the second end portion 143a. The second opening 260b has the same shape as the second opening 260a, and is formed for the purpose of dividing the closed loop pattern that is formed of the second side wall 240b and surrounds the second end portion 143b, and dividing the second end portion 143b. Further, the second openings 260a, 260b can have a shape different from each other. In addition, the second openings 260a, 260b are only required to have a size sufficient for at least being capable of dividing the closed loop pattern formed of the second side walls 240a, 240b.

Next, the second end portion 143a and the second side wall 240a that are exposed in the second opening 260a, and the second end portion 143b and the second side wall 240b that are exposed in the second opening 260b are removed by the RIE method or the like in which the third pattern 26 is used as a mask. Subsequently, the third pattern 26 is removed.

Here, the second end portion 143a is divided into the end portion 145a and the end portion 145b, and the second end portion 143b is divided into the end portion 145c and the end portion 145d.

Next, the first film 12 is patterned by the RIE method or the like in which the second film 14 and the second side walls 240a, 240b that are left on the first film 12 are used as a mask (for example, refer to FIG. 2J).

Next, the film to be processed 11 is patterned by the RIE method or the like in which the second film 14 and the second side walls 240a, 240b, and the first film 12 that are left on the film to be processed 11 are used as a mask, and the second film 14 and the second side walls 240a, 240b, and the first film 12 are removed (for example, refer to FIG. 2K). The film to be processed 11 is patterned, so that wirings 4a to 4f formed of the film to be processed 11 are formed. The linear parts of the wirings 4a to 4f form a line and space pattern in which a line width and a space width have a width of hp/3 that is smaller than an exposure light resolution limit.

Next, an interlayer insulating film 28 is formed so as to cover the film to be processed 11 by the CVD method or the like.

Next, a fourth pattern 30 including openings 300a to 300f corresponding to the contacts 32a to 32f is formed on the interlayer insulating film 28 by the photolithography method (for example, refer to FIG. 1J).

The opening 300a is formed in an upper layer of the wiring 4a and the end portion 145A. The opening 300b is formed in an upper layer of the first end portion 142A of the wiring 4b. The opening 300c is formed in an upper layer of the wiring 4c and the end portion 145B. The opening 300d is formed in an upper layer of the wiring 4d and the end portion 145C. The opening 300e is formed in an upper layer of the first end portion 142B of the wiring 4e. The opening 300f is formed in an upper layer of the wiring 4f and the end portion 145D. The openings 300a to 300f are formed so as to have a distance of not less than hp between each other. Further, the first end portions 142A, 142B and the end portions 145A, 145B, 145C, 145D shown in FIG. 6C are obtained by that the first end portions 142a, 142b and the end portions 145a, 145b, 145c, 145d in the second film 14 are transferred to the film to be processed 11.

Next, the interlayer insulating film 28 exposed in the openings 300a to 300f is etched by the RIE method or the like.

Next, as shown in FIG. 6C, a metal film is formed on the interlayer insulating film 28 and in the openings 300a to 300f by a sputtering method or the like, the metal film on the interlayer insulating film 28 is removed by the CMP method or the like so that the contacts 32a to 32f to be connected to the wirings 4a to 4f are formed, and subsequently, via well-known processes, a desired semiconductor device is obtained.

Advantages of Third Embodiment

In accordance with the third embodiment, even if the end portions 141a, 141b extend in an almost parallel direction to a longitudinal direction of the linear parts 140a, 140b, the end portions 141a, 141b are divided in an almost parallel direction to the longitudinal direction of the linear parts 140a, 140b, so that the contacts 32a to 32f can be easily formed Fourth Embodiment Hereinafter, a fourth embodiment will be explained. The fourth embodiment is different from each of the above-mentioned embodiments, in that it is not required that the opening width is processed to be thinned.

(Manufacturing Method of Semiconductor Device)

FIGS. 7A to 7K are top views showing one example of a manufacturing process of the semiconductor device according to a fourth embodiment.

First, a first film 12 is formed on a semiconductor substrate 10 in which a film to be processed 11 is formed and a second film 14 is formed on the formed first film 12.

Figure 7A:
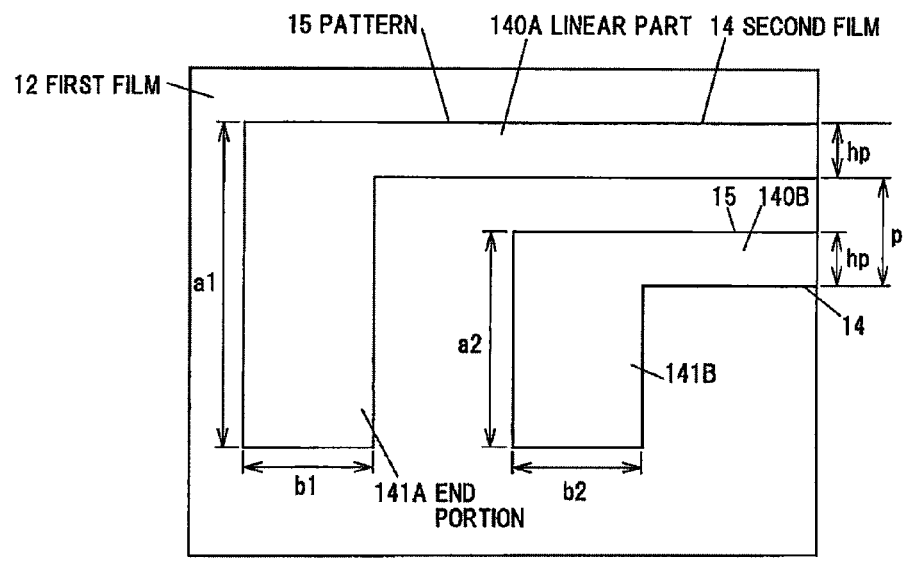
FIGS. 7A to 7K are top views showing one example of a manufacturing process of the semiconductor device according to a fourth embodiment.

Next, as shown in FIG. 7A, the formed second film 14 is processed to a pattern 15 including a plurality of linear parts 140A, 140B and end portions 141A, 141B formed in an end of each of the linear parts 140A, 140B, having a width wider than the linear parts 140A, 140B by a photolithography method.

As shown in FIG. 7A, the pattern 15 includes a plurality of line patterns of nearly L-shape formed of the linear part 140A and the end portion 141A, and the linear part 140B and the end portion 141B. The linear parts 140A, 140B are aligned at a pitch (p). A ratio of a line width and a space width of the linear parts 140A, 140B is almost 1:1, and each of the widths is hp. Further, the widths (a1), (a2), (b1), (b2) of the end portions 141A, 141B, and the widths (a3), (a4), (b3), (b4) of the end portions 141a, 141b after the slimming are widths that satisfy the same condition as the first embodiment.

Figure 7B:
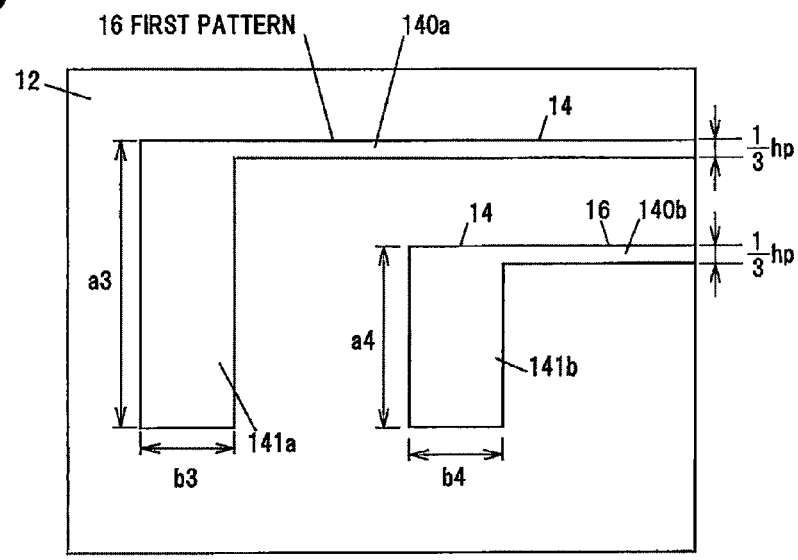

Next, as shown in FIG. 7B, the pattern 15 is slimmed so that the line widths of the linear parts 140A, 140B of the formed pattern 15 become a desired width, and a first pattern 16 is formed.

Figure 7C:
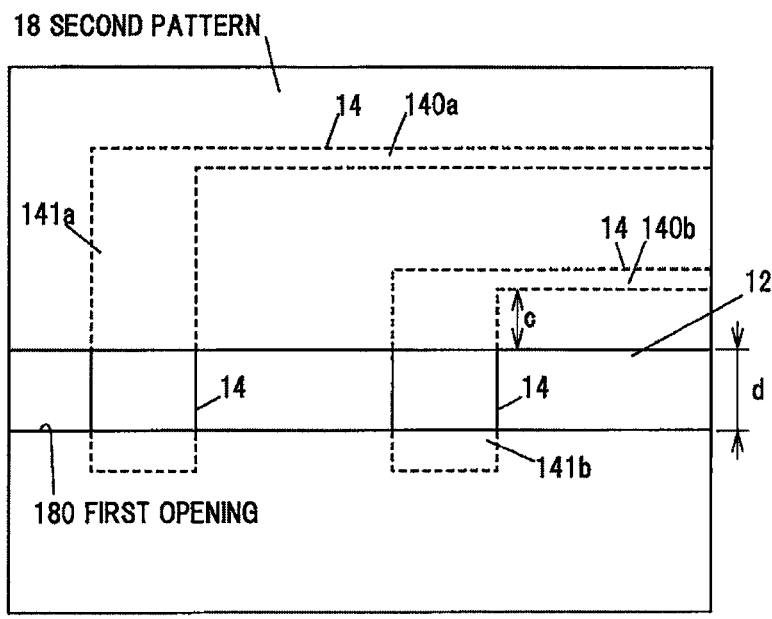

Next, as shown in FIG. 7C, a second pattern 18 including a first opening 180 that traverses the end portions 141a, 141b of the first pattern 16 is formed on the second film 14 by the photolithography method.

The first opening 180, for example, has a width (d) of 4 hp/3 in a direction almost perpendicular to the longitudinal direction of the linear parts 140a, 140b. When the width (d) is not less than hp and not more than 4 hp/3, it is not required that the opening width is processed to be thinned. In addition, the first opening 180, for example, has a distance (c) of not less than 2 hp/3 between an opening edge of the first opening 180 in side of the linear parts 140a, 140b and the linear part 140b nearest to the opening edge.

Next, the second film 14 exposed in the first opening 180 is etched by the RIE method or the like, and the end portions 141a, 141b are divided into first end portions 142a, 142b close to the linear parts 140a, 140b and second end portions 143a, 143b apart from the linear parts 140a, 140b. Subsequently, the second pattern 18 is removed.

Figure 7D:
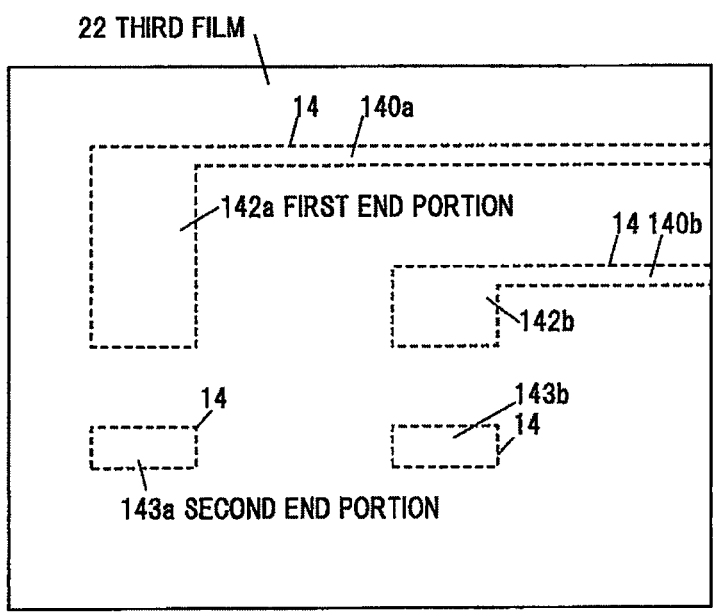

Next, as shown in FIG. 7D, a third film 22 is formed to have the same thickness as the width (hp/3) of the linear parts 140a, 140b so as to cover the first and second films 12, 14 by the CVD method or the like.

Figure 7E:
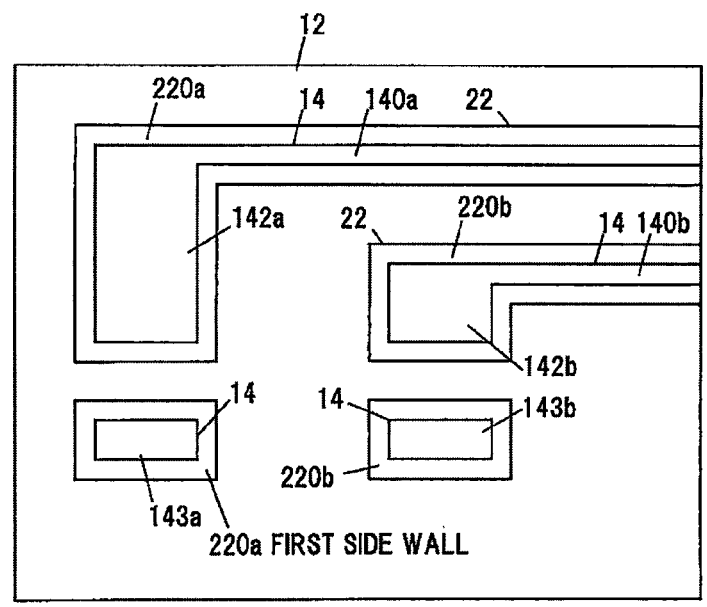

Next, as shown in FIG. 7E, the third film 22 is etched back by the film thickness thereof by the RIE method or the like, so as to form first side walls 220a, 220b formed of the third film 22 in a side surface of the second film 14.

In particular, the first side wall 220a is formed in side surfaces of the linear part 140a, the first end portion 142a and the second end portion 143a, and the first side wall 220b is formed in side surfaces of the linear part 140b, the first end portion 142b and the second end portion 143b. A distance between the fisrt side wall 220a formed around the first end portion 142a and the fisrt side wall 220a formed around the second end portion 143a, and a distance between the fisrt side wall 220b formed around the first end portion 142b and the fisrt side wall 220b formed around the second end portion 143b become 2 hp/3.

Figure 7F:
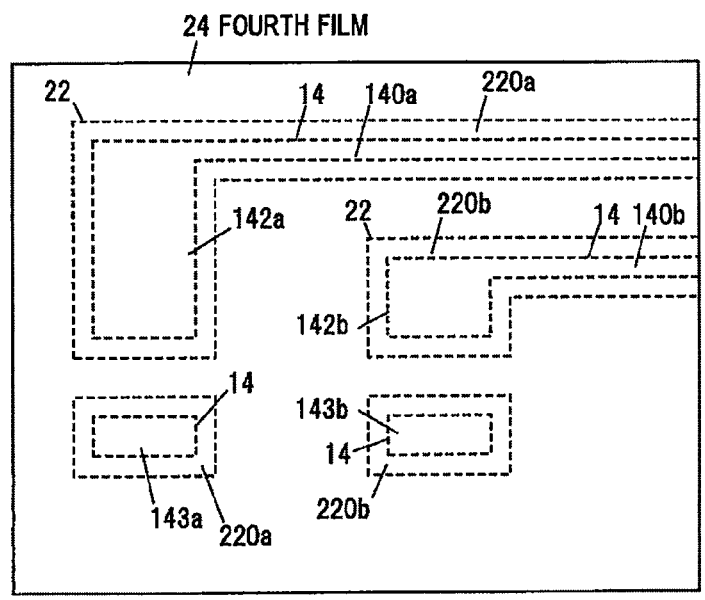

Next, as shown in FIG. 7F, a fourth film 24 is formed to have the same thickness as the width (hp/3) of the linear parts 140a, 140b so as to cover the first to third films 12, 14, 22 by the CVD method or the like.

Figure 7G:
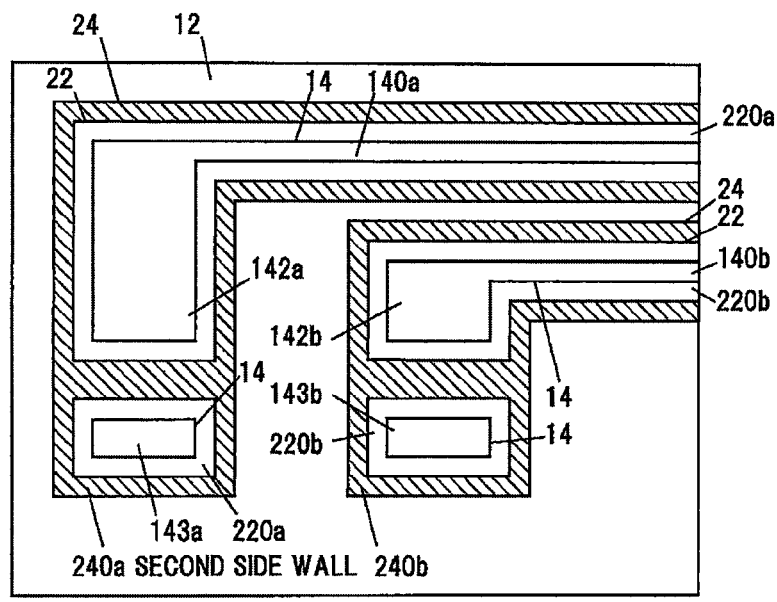

Next, as shown in FIG. 7G, the fourth film 24 is etched back by the film thickness thereof by the RIE method or the like, so as to form second side walls 240a, 240b formed of the fourth film 24 in side surfaces of the first side walls 220a, 220b so as to form a closed loop pattern sequentially formed around the first end portions 142a, 142b and the second end portions 143a, 143b.

At this time, the fourth film 24 is embedded with no space between the first end portion 142a and the second end portion 143a and between the first end portion 142b and the second end portion 143b. When space occurs therebetween, the second side walls 240a, 240b formed around the first end portions 142a, 142b and the second side walls 240a, 240b formed around the second end portions 143a, 143b are separated from each other, the wirings formed based on the second side walls 240a, 240b are shortened, and there is no enough distance between the contacts formed on the upper layer of the wirings, so that it becomes difficult to form the contacts.

Figure 7H:
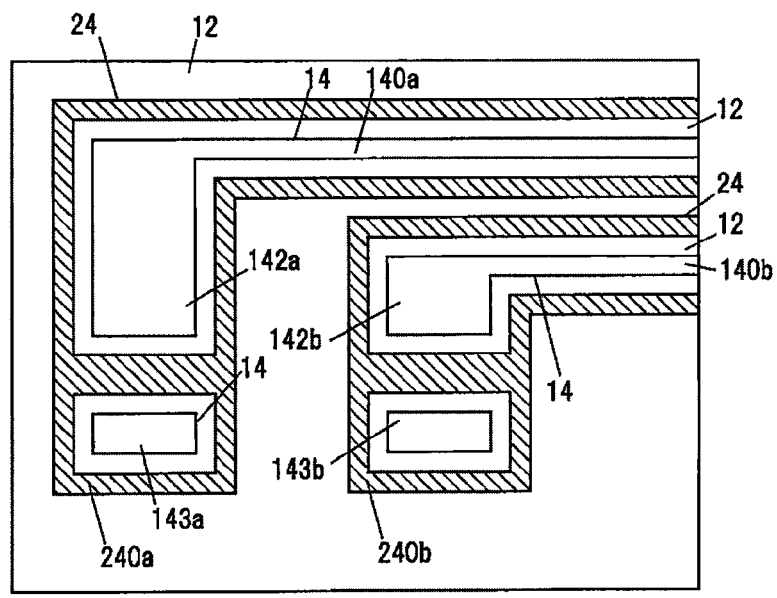

Next, as shown in FIG. 7H, the first side walls 220a, 220b in whose side surfaces the second side walls 240a, 240b are formed is removed by a wet etching method or the like, and the second films 14 and the second side walls 240a, 240b used as masks for patterning the first film 12 are left on the first film 12.

Figure 7I:
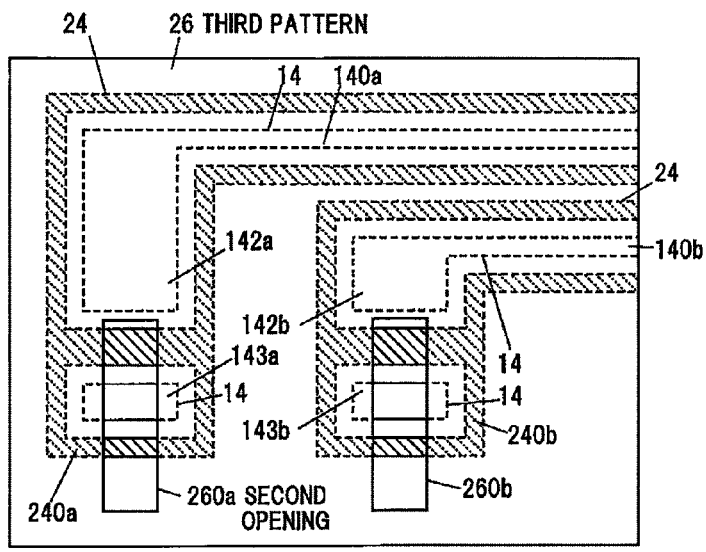

Next, as shown in FIG. 7I, by the photolithography method, the third pattern 26 including the second openings 260a, 260b that traverse over the closed loop formed of the second side walls 240a, 240b is formed, and the closed loop pattern formed of the second side walls 240a, 240b is divided.

The second opening 260a, for example, has a rectangular shape extending in a direction almost perpendicular to a longitudinal direction of the linear part 140a, and is formed for the purpose of dividing the closed loop pattern that is formed of the second side wall 240a and surrounds the second end portion 143a, and dividing the second end portion 143a. The second opening 260b has the same shape as the second opening 260a, and is formed for the purpose of dividing the closed loop pattern that is formed of the second side wall 240b and surrounds the second end portion 143b, and dividing the second end portion 143b. Further, the second openings 260a, 260b can have a shape different from each other.

Next, the second end portion 143a and the second side wall 240a that are exposed in the second opening 260a, and the second end portion 143b and the second side wall 240b that are exposed in the second opening 260b are removed by the RIE method or the like in which the third pattern 26 is used as a mask. Subsequently, the third pattern 26 is removed.

Here, the second end portion 143a is divided into a pattern corresponding to the end portions 145A, 145B described below, and the second end portion 143b is divided into a pattern corresponding to the end portions 145C, 145D described below.

Next, the first film 12 is patterned by the RIE method or the like in which the second film 14 and the second side walls 240a, 240b that are left on the first film 12 are used as a mask.

Next, the film to be processed 11 is patterned by the RIE method or the like in which the second film 14 and the second side walls 240a, 240b, and the first film 12 that are left on the film to be processed 11 are used as a mask, and the second film 14 and the second side walls 240a, 240b, and the first film 12 are removed. The film to be processed 11 is patterned, so that wirings 4a to 4f formed of the film to be processed 11 are formed. The linear parts of the wirings 4a to 4f form a line and space pattern in which a line width and a space width have a width of hp/3 that is smaller than the exposure light resolution limit.

Next, the interlayer insulating film 28 is formed so as to cover the film to be processed 11 by the CVD method or the like.

Figure 7J:
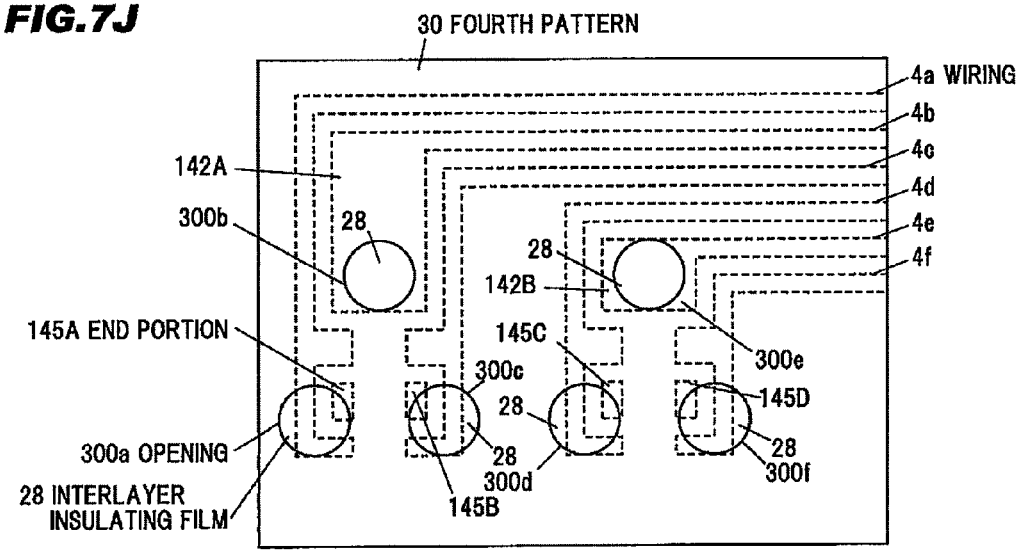

Next, as shown in FIG. 7J, the fourth pattern 30 including openings 300a to 300f corresponding to the contacts 32a to 32f is formed on the interlayer insulating film 28 by the photolithography method.

The opening 300a is formed in an upper layer of the wiring 4a and the end portion 145A. The opening 300b is formed in an upper layer of the first end portion 142A of the wiring 4b. The opening 300c is formed in an upper layer of the wiring 4c and the end portion 145B. The opening 300d is formed in an upper layer of the wiring 4d and the end portion 145C. The opening 300e is formed in an upper layer of the first end portion 142B of the wiring 4e. The opening 300f is formed in an upper layer of the wiring 4f and the end portion 145D. The openings 300a to 300f are formed so as to have a distance of not less than hp between each other.

Next, the interlayer insulating film 28 exposed in the openings 300a to 300f is etched by the RIE method or the like. Subsequently, the fourth pattern 30 is removed.

Figure 7K:
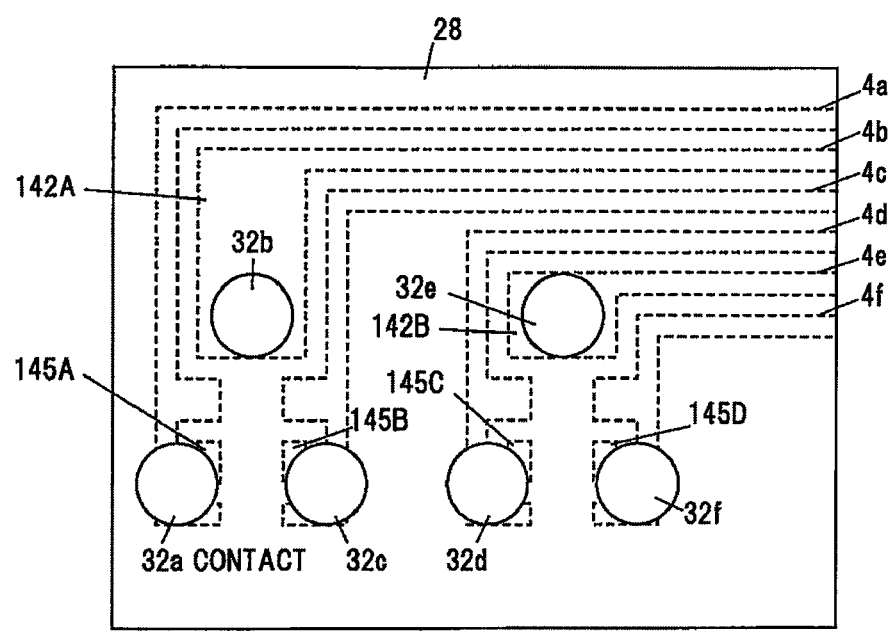

Next, as shown in FIG. 7K, a metal film is formed on the interlayer insulating film 28 and in the openings 300a to 300f by a sputtering method or the like, the metal film on the interlayer insulating film 28 is removed by the CMP method or the like so that the contacts 32a to 32f to be connected to the wirings 4a to 4f are formed, and subsequently, via well-known processes, a desired semiconductor device is obtained.

Advantages of Fourth Embodiment

In accordance with the fourth embodiment according to the invention, the first openings 180 is formed to have a width of 4 hp/3, so that the number of processes can be decreased and the manufacturing cost can be also reduced in comparison with a case that the first openings 180 is formed to have a width smaller than the exposure light resolution limit.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a semiconductor device, comprising:
   forming a first film on a semiconductor substrate and forming a second film on the first film formed;
   processing the formed second film to a first pattern including a plurality of linear parts and end portions formed in an end of each of the linear parts, having a width wider than the linear parts,
   forming a second pattern including a first opening that traverses the end portions of the first pattern on the second film;
   etching the second film of the second pattern, exposed in the first opening, so as to divide the end portion into an end portion close to the linear part and an end portion apart from the linear part;
   forming a third film so as to cover the first film and the second film after the end portion is divided, and etching back the third film so as to form a first side wall formed of the third film on side surfaces of the second film;
   forming a fourth film so as to cover the first to third films, and etching back the fourth film so as to form a second side wall formed of the fourth film on side surfaces of the first side wall so as to form a closed loop pattern sequentially formed around the divided end portion; and
   dividing the closed loop pattern, or a closed loop pattern formed in the first film by using the second side wall as a mask.

2. The method of manufacturing a semiconductor device according to claim 1, further comprising:
   before the closed loop pattern is divided, removing the first side wall in whose side surface the second side wall is formed, and leaving the second film and the second side wall that are used as a mask for patterning the first film on the first film.

3. The method of manufacturing a semiconductor device according to claim 2, wherein the first pattern is formed by that the formed second film is processed to a pattern including a plurality of line patterns of nearly L-shape formed of a linear part and an end portion having a width wider than the linear part, and then a slimming is carried out to the pattern.

4. The method of manufacturing a semiconductor device according to claim 3, wherein the first pattern is formed by that the pattern is formed so that a ratio of a line width to a space width of the plurality of linear parts becomes almost 1:1, and the slimming is carried out to the pattern until the line width of each linear part becomes almost $1/3$.

5. The method of manufacturing a semiconductor device according to claim 3, wherein the dividing the end portion includes that an upper layer film is formed on the second pattern and in the first opening and the first opening is processed so as to have a narrower width, and then the second film exposed is etched.

6. The method of manufacturing a semiconductor device according to claim 3, wherein the first opening is formed so as to have an opening width not more than four times of a line width of the linear part of the first pattern after the slimming is carried out.

7. The method of manufacturing a semiconductor device according to claim 3, wherein the first side wall formed of the third film and the second side wall formed of the fourth film are formed so that the third and fourth films have film thickness substantively equal to a line width of the linear part of the first pattern after the slimming is carried out.

8. The method of manufacturing a semiconductor device according to claim 2, wherein the dividing the end portion includes that an upper layer film is formed on the second pattern and in the first opening and the first opening is processed so as to have a narrower width, and then the second film exposed is etched.

9. The method of manufacturing a semiconductor device according to claim 1, wherein the first pattern is formed by that the formed second film is processed to a pattern including a plurality of line patterns of nearly L-shape formed of a linear part and end portions having a width wider than the linear parts, and then a slimming is carried out to the pattern.

10. The method of manufacturing a semiconductor device according to claim 9, wherein the first pattern is formed by that the pattern is formed so that a ratio of a line width to a space width of the plurality of linear parts becomes almost 1:1, and the slimming is carried out to the pattern until the line width of each linear part becomes almost $1/3$.

11. The method of manufacturing a semiconductor device according to claim 10, wherein the dividing the end portion includes that an upper layer film is formed on the second pattern and in the first opening and the first opening is processed so as to have a narrower width, and then the second film exposed is etched.

12. The method of manufacturing a semiconductor device according to claim 10, wherein the first opening is formed so as to have an opening width not more than four times of a line width of the linear part of the first pattern after the slimming is carried out.

13. The method of manufacturing a semiconductor device according to claim 10, wherein the first side wall formed of the third film and the second side wall formed of the fourth film are formed so that the third and fourth films have film thickness substantively equal to a line width of the linear part of the first pattern after the slimming is carried out.

14. The method of manufacturing a semiconductor device according to claim 9, wherein the dividing the end portion includes that an upper layer film is formed on the second pattern and in the first opening and the first opening is processed so as to have a narrower width, and then the second film exposed is etched.

15. The method of manufacturing a semiconductor device according to claim 9, wherein the first opening is formed so as to have an opening width not more than four times of a line width of the linear part of the first pattern after the slimming is carried out.

16. The method of manufacturing a semiconductor device according to claim 9, wherein the first side wall formed of the third film and the second side wall formed of the fourth film are formed so that the third and fourth films have film thickness substantively equal to a line width of the linear part of the first pattern after the slimming is carried out.

17. The method of manufacturing a semiconductor device according to claim 1, wherein the dividing the end portion includes that an upper layer film is formed on the second pattern and in the first opening and the first opening is processed so as to have a narrower width, and then the second film exposed is etched.

18. The method of manufacturing a semiconductor device according to claim 1, wherein in forming the second pattern having the first opening, the first opening is formed at a location in which a distance from the first opening after the opening width thereof is thinned by a shrink method to the linear part of the first pattern after the slimming is carried out becomes not less than two times of the line width of the linear part of the first pattern after the slimming is carried out.

19. The method of manufacturing a semiconductor device according to claim 1, further comprising:
 dividing the end portion in an almost perpendicular direction to a longitudinal direction of the linear part.

20. The method of manufacturing a semiconductor device according to claim 1, further comprising:
 dividing the end portion in an almost parallel direction to a longitudinal direction of the linear part.

* * * * *